United States Patent
Heinrich

(10) Patent No.: US 9,633,302 B1
(45) Date of Patent: Apr. 25, 2017

(54) RFID INTEGRATED CIRCUITS WITH CHANNELS FOR REDUCING MISALIGNMENT

(71) Applicant: Impinj, Inc., Seattle, WA (US)

(72) Inventor: Harley K. Heinrich, Snohomish, WA (US)

(73) Assignee: Impinj, Inc., Seattle, WA (US)

( * ) Notice: Subject to any disclaimer, the term of this patent is extended or adjusted under 35 U.S.C. 154(b) by 31 days.

(21) Appl. No.: 14/675,158

(22) Filed: Mar. 31, 2015

(51) Int. Cl.
  *G06K 19/06* (2006.01)
  *G06K 19/077* (2006.01)
  *H01L 23/00* (2006.01)

(52) U.S. Cl.
  CPC ........ *G06K 19/07754* (2013.01); *H01L 24/83* (2013.01)

(58) Field of Classification Search
  CPC ........... G06K 19/077; G06K 19/07745; G06K 19/07747; G06K 19/07749; H01L 24/80; H01L 24/83
  USPC ....................................................... 235/492
  See application file for complete search history.

(56) References Cited

U.S. PATENT DOCUMENTS

| | | | |
|---|---|---|---|
| 8,881,373 B1 * | 11/2014 | Koepp | ......................... 29/592.1 |
| 9,219,529 B2 * | 12/2015 | Akiyama | .......... G06K 19/07749 |
| 9,495,631 B1 * | 11/2016 | Koepp | .............. G06K 19/07749 |
| 2012/0024959 A1 * | 2/2012 | Minagawa | .......... G06K 19/0772 |
| | | | 235/488 |
| 2014/0144992 A1 * | 5/2014 | Diorio | ................ G06K 7/10297 |
| | | | 235/488 |
| 2014/0361090 A1 * | 12/2014 | Baba | ................ G06K 19/07758 |
| | | | 235/492 |

* cited by examiner

*Primary Examiner* — Thien M Le
*Assistant Examiner* — April Taylor
(74) *Attorney, Agent, or Firm* — Turk IP Law, LLC

(57) ABSTRACT

Embodiments are directed to an RFID tag integrated circuit (IC) having antenna contacts separated by a channel. The channel has a smaller cross-section at its center than at its ends, which facilitates fluid flow from the channel center to the channel ends. During attachment of the IC to an inlay or strap, the channel facilitates the flow of liquid adhesive so as to reduce the turbulence and the propagation velocity associated with the liquid adhesive, thereby reducing misalignment caused by the movement of the IC with respect to the inlay or strap.

20 Claims, 12 Drawing Sheets

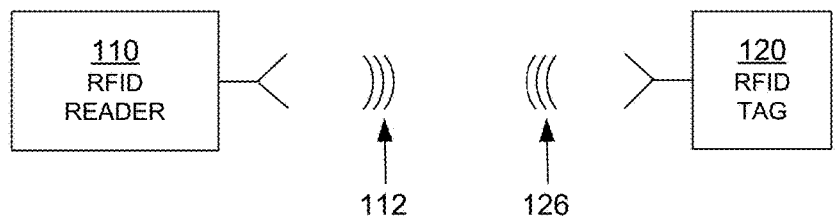
FIG. 1
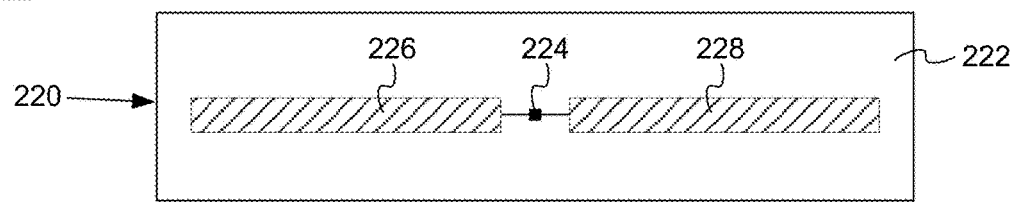
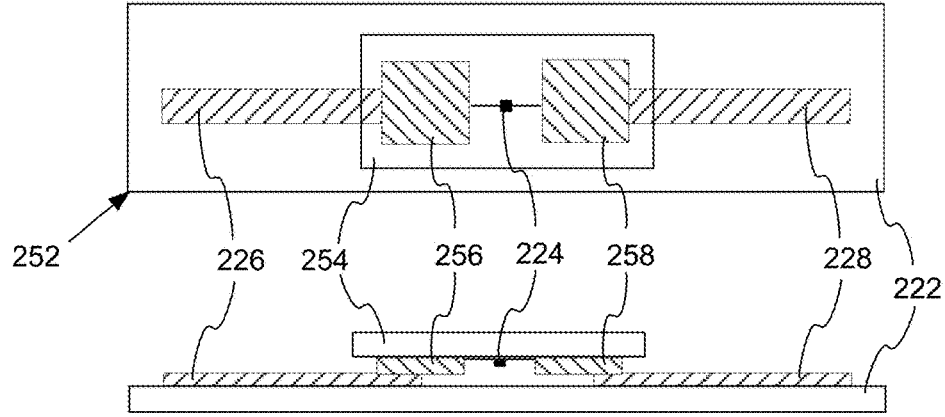
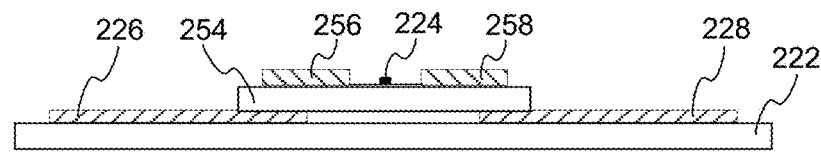
FIG. 2

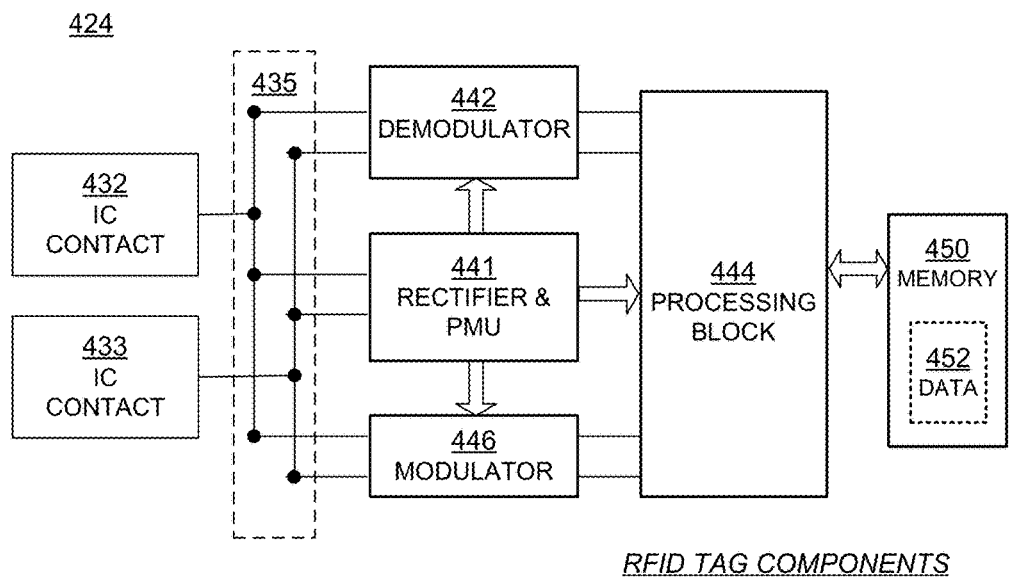
FIG. 4
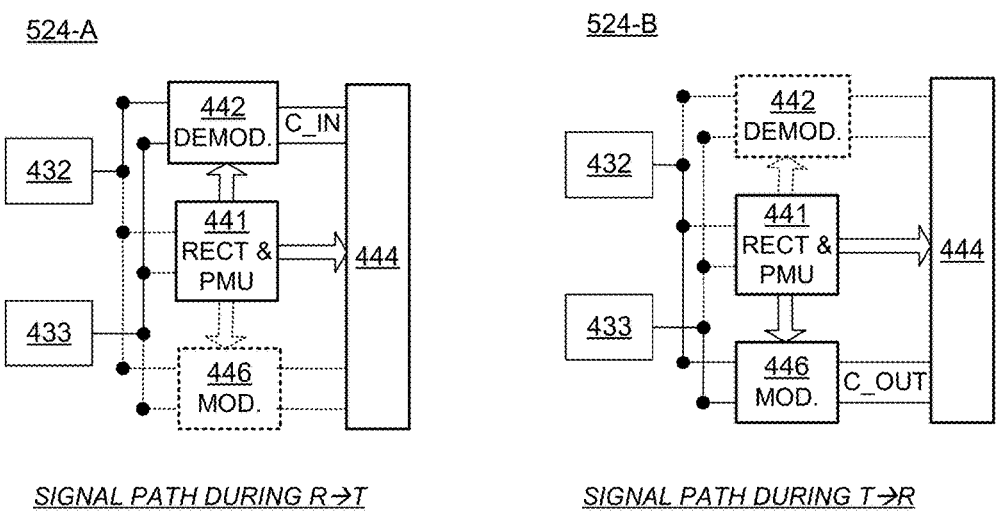
FIG. 5A   FIG. 5B

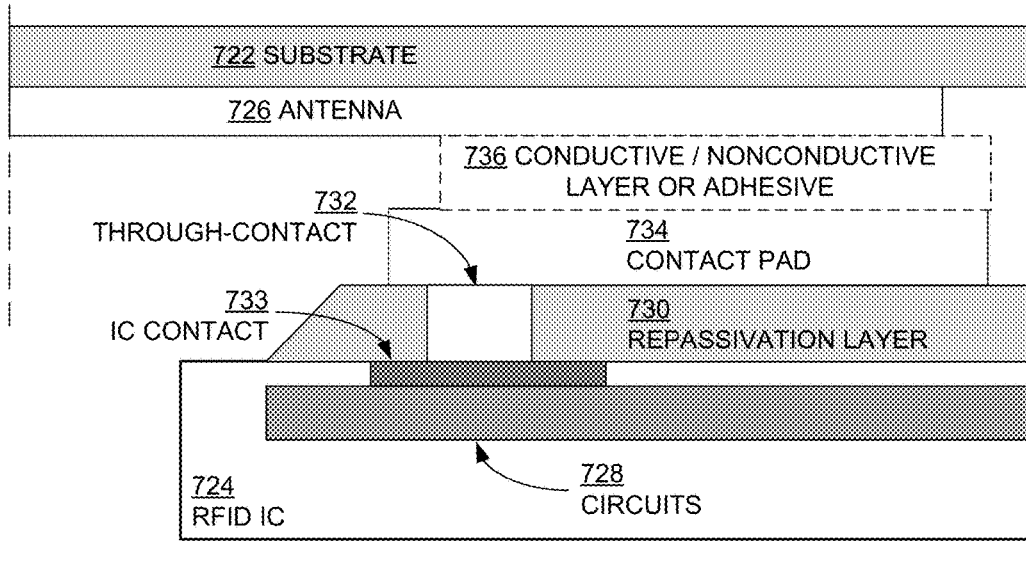
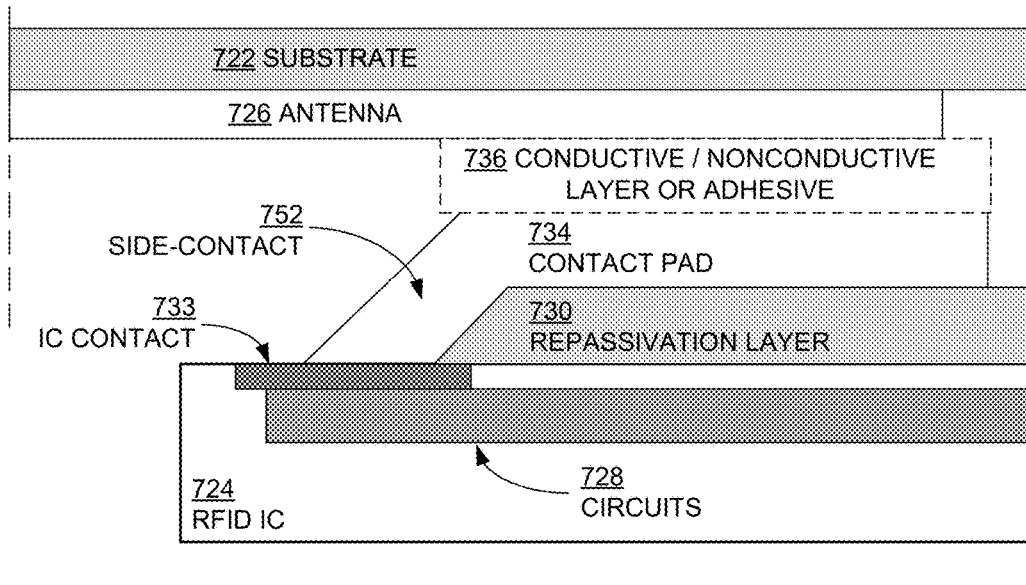
FIG. 7

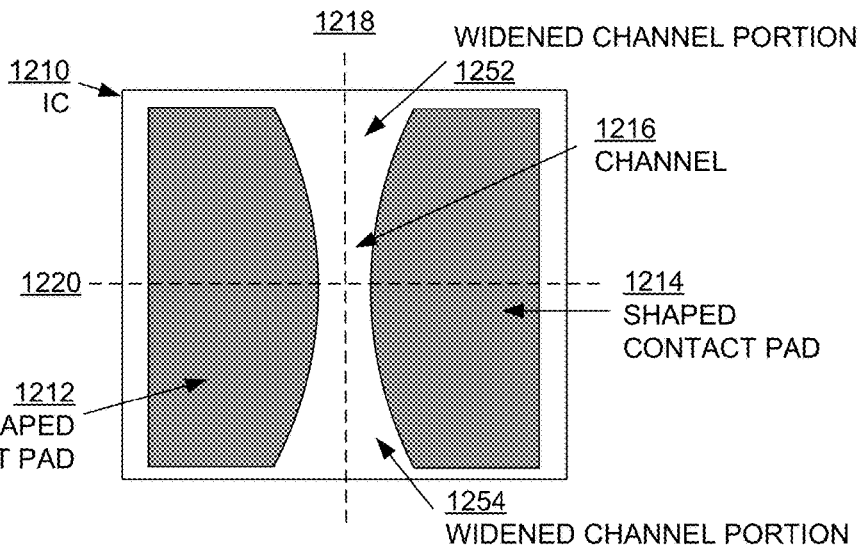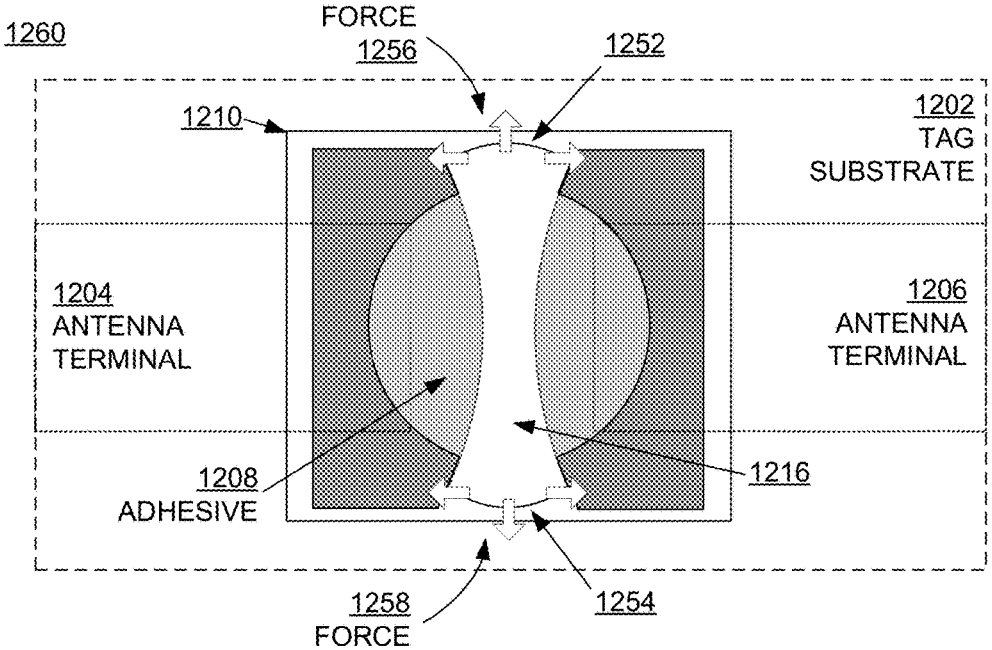
FIG. 12

RFID INTEGRATED CIRCUITS WITH CHANNELS FOR REDUCING MISALIGNMENT

BACKGROUND

Radio-Frequency Identification (RFID) systems typically include RFID readers, also known as RFID reader/writers or RFID interrogators, and RFID tags. RFID systems can be used in many ways for locating and identifying objects to which the tags are attached. RFID systems are useful in product-related and service-related industries for tracking objects being processed, inventoried, or handled. In such cases, an RFID tag is usually attached to an individual item, or to its package.

In principle, RFID techniques entail using an RFID reader to interrogate one or more RFID tags. The reader transmitting a Radio Frequency (RF) wave performs the interrogation. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF wave may respond by transmitting back another RF wave. The tag either generates the transmitted back RF wave originally, or by reflecting back a portion of the interrogating RF wave in a process known as backscatter. Backscatter may take place in a number of ways.

The reflected-back RF wave may encode data stored in the tag, such as a number. The response is demodulated and decoded by the reader, which thereby identifies, counts, or otherwise interacts with the associated item. The decoded data can denote a serial number, a price, a date, a destination, other attribute(s), any combination of attributes, and so on. Accordingly, when a reader receives tag data it can learn about the item that hosts the tag and/or about the tag itself.

An RFID tag typically includes an RFID integrated circuit (IC) electrically coupled to an antenna on a tag substrate. The RFID IC, also known as an RFID chip, includes a radio section, a power-management section, and frequently a logical section, a memory, or both. In some RFID tags the power-management section may include an energy storage device such as a battery, which may be included on the IC or external to the IC. RFID tags with an energy storage device are known as battery-assisted, semi-active, or active tags. Other RFID tags can be powered solely by the RF signal they receive. Such RFID tags do not include an energy storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Embodiments are directed to an RFID tag integrated circuit (IC) having antenna contacts separated by a channel. The channel may have a smaller cross-section at its center than at its ends, which may facilitate fluid flow from the channel center to the channel ends. During attachment of the IC to an inlay or strap, the channel may facilitate the flow of liquid adhesive so as to reduce the turbulence and propagation velocity associated with the liquid adhesive, thereby reducing misalignment caused by the movement of the IC with respect to the inlay or strap.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying drawings, in which:

FIG. 1 is a block diagram of components of an RFID system.

FIG. 2 is a diagram showing components of passive RFID tags formed by a variety of methods; each can be used in the system of FIG. 1.

FIG. 4 is a block diagram showing a detail of an RFID integrated circuit (IC) for an RFID tag, such as the ICs and tags shown in FIG. 2.

FIGS. 5A and 5B illustrate signal paths during tag-to-reader and reader-to-tag communications in the block diagram of FIG. 4.

FIG. 7 illustrates detailed cross-sections of RFID ICs with contact pads electrically coupling to antennas according to embodiments.

FIG. 12 depicts an alternate channel configuration configured to reduce misalignment due to liquid propagation during IC-substrate attachment, according to embodiments.

DETAILED DESCRIPTION

Figure 3:
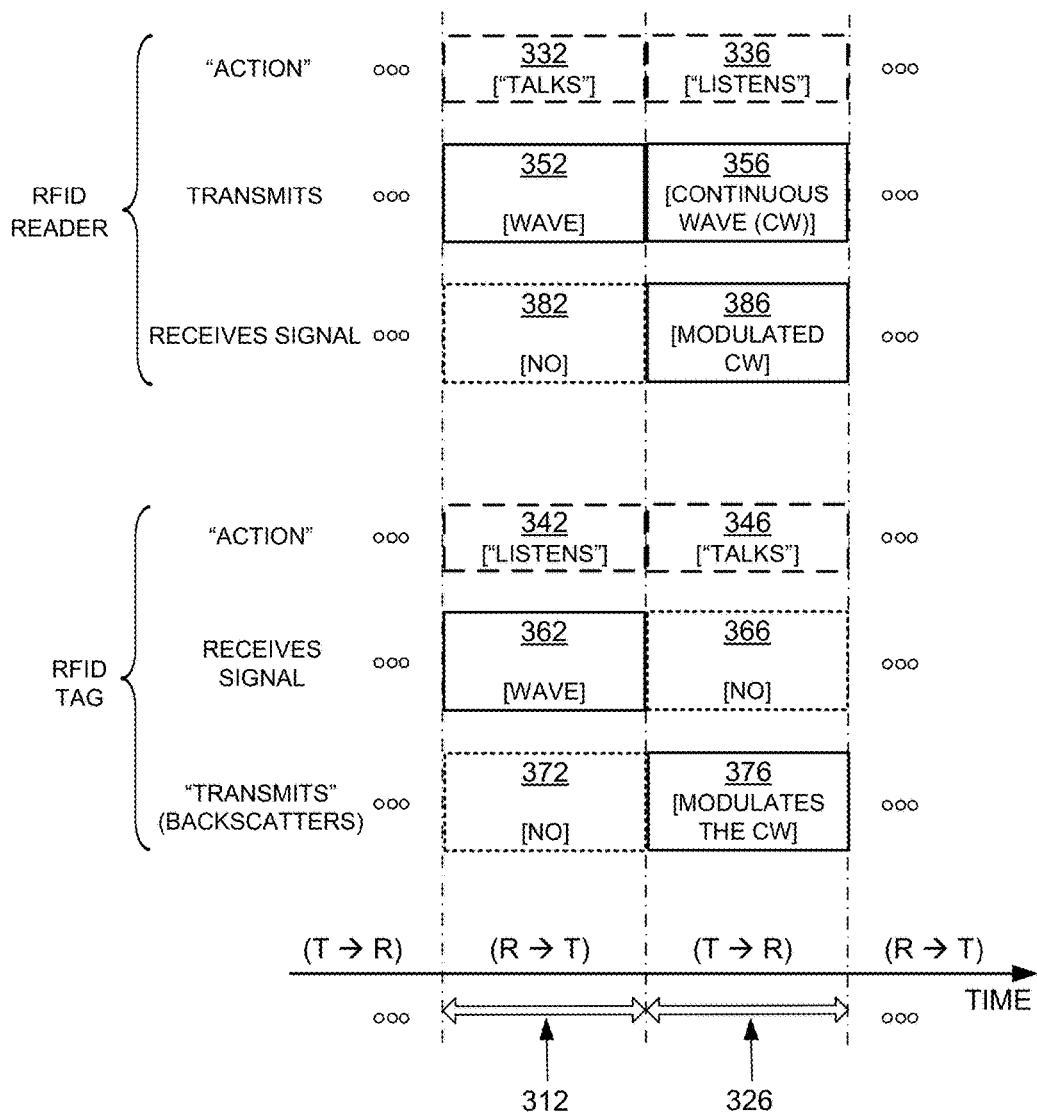
FIG. 3 is a conceptual diagram for explaining a half-duplex mode of communication between the components of the RFID system of FIG. 1.

In the following detailed description, references are made to the accompanying drawings that form a part hereof, and in which are shown by way of illustration specific embodiments or examples. These embodiments or examples may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

As used herein, "memory" is one of ROM, RAM, SRAM, DRAM, NVM, EEPROM, FLASH, Fuse, MRAM, FRAM, and other similar information-storage technologies as will be known to those skilled in the art. Some portions of memory may be writeable and some not. "Command" refers to a reader request for one or more tags to perform one or more actions. "Protocol" refers to an industry standard for communications between a reader and a tag (and vice versa), such as the Class-1 Generation-2 UHF RFID Protocol for Communications at 860 MHz-960 MHz by EPCglobal, Inc. ("Gen2 Specification"), version 1.2.0 of which is hereby incorporated by reference.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which may be implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable IC contacts (not shown in FIG. 2). The term "electrically coupled" as used herein may mean a direct electrical connection, or it may mean a connection that includes one or more intervening circuit blocks, elements, or devices. The "electrical" part of the term "electrically coupled" as used in this document shall mean a coupling that is one or more of ohmic/galvanic, capacitive, and/or inductive. Similarly, the term "electrically isolated" as used herein may mean that electrical coupling of one or more types (e.g., galvanic, capacitive, and/or inductive) is not present, at least to the extent possible. For example, elements that are electrically isolated from each other may be galvanically isolated from each other, capacitively isolated from each other, and/or inductively isolated from each other.

IC 224 is shown with a single antenna port, comprising two IC contacts electrically coupled to two antenna segments 226 and 228 which are shown here forming a dipole. Many other embodiments are possible using any number of ports, contacts, antennas, and/or antenna segments.

Diagram 250 depicts top and side views of tag 252, formed using a strap. Tag 252 differs from tag 220 in that it includes a substantially planar strap substrate 254 having strap contacts 256 and 258. IC 224 is mounted on strap substrate 254 such that the IC contacts on IC 224 electrically couple to strap contacts 256 and 258 via suitable connections (not shown). Strap substrate 254 is then placed on inlay 222 such that strap contacts 256 and 258 electrically couple to antenna segments 226 and 228. Strap substrate 254 may be affixed to inlay 222 via pressing, an interface layer, one or more adhesives, or any other suitable means.

Diagram 260 depicts a side view of an alternative way to place strap substrate 254 onto inlay 222. Instead of strap substrate 254's surface, including strap contacts 256/258, facing the surface of inlay 222, strap substrate 254 is placed with its strap contacts 256/258 facing away from the surface of inlay 222. Strap contacts 256/258 can then be either capacitively coupled to antenna segments 226/228 through strap substrate 254, or conductively coupled using a through-via which may be formed, for example, by crimping strap contacts 256/258 to antenna segments 226/228. In some embodiments the positions of strap substrate 254 and inlay 222 may be reversed, with strap substrate 254 mounted beneath inlay 222 and strap contacts 256/258 electrically coupled to antenna segments 226/228 through inlay 222. Of course, in yet other embodiments strap contacts 256/258 may electrically couple to antenna segments 226/228 through both inlay 222 and strap substrate 254.

In operation, the antenna receives a signal and communicates it to IC 224, which both harvests power and responds if appropriate, based on the incoming signal and the IC's internal state. If IC 224 uses backscatter modulation then it responds by modulating the antenna's reflectance, which generates response signal 126 from signal 112 transmitted by the reader. Electrically coupling and uncoupling the IC contacts of IC 224 can modulate the antenna's reflectance, as can varying the admittance of a shunt-connected circuit element which is coupled to the IC contacts. Varying the impedance of a series-connected circuit element is another means of modulating the antenna's reflectance.

In the embodiments of FIG. 2, antenna segments 226 and 228 are separate from IC 224. In other embodiments the antenna segments may alternatively be formed on IC 224. Tag antennas according to embodiments may be designed in any form and are not limited to dipoles. For example, the tag antenna may be a patch, a slot, a loop, a coil, a horn, a spiral, a monopole, microstrip, stripline, or any other suitable antenna.

IC 224 may be attached to a substrate such as inlay 222 and strap substrate 254 using a conductive or nonconductive adhesive or interposing layer. For example, adhesive may be disposed between IC 224 and the substrate to attach IC 224 to the substrate. As another example, IC 224 may be disposed onto the substrate, and adhesive may be placed onto IC 224 and the substrate so as to hold IC 224 to the substrate. In other embodiments, no adhesive or interposing layer may be used. For example, IC 224 may be pressed onto the substrate with enough physical force to prevent IC 224 from dislodging, or another substrate portion (of the substrate or another substrate) may be folded or placed over IC 224 to keep the IC on the substrate. Similarly, the IC contacts of IC 224 may be electrically coupled to an antenna via a conductive or nonconductive adhesive or layer, or may directly contact the antenna without interposing layers.

The components of the RFID system of FIG. 1 may communicate with each other in any number of modes. One such mode is called full duplex. Another such mode is called half-duplex, and is described below.

FIG. 3 is a conceptual diagram 300 for explaining half-duplex communications between the components of the RFID system of FIG. 1, in this case with tag 120 implemented as passive tag 220 of FIG. 2. The explanation is made with reference to a TIME axis, and also to a human metaphor of "talking" and "listening". The actual technical implementations for "talking" and "listening" are now described.

RFID reader 110 and RFID tag 120 talk and listen to each other by taking turns. As seen on axis TIME, when reader 110 talks to tag 120 the communication session is designated as "R→T", and when tag 120 talks to reader 110 the communication session is designated as "T→R". Along the TIME axis, a sample R→T communication session occurs during a time interval 312, and a following sample T→R communication session occurs during a time interval 326. Of course interval 312 is typically of a different duration than interval 326—here the durations are shown approximately equal only for purposes of illustration.

According to blocks 332 and 336, RFID reader 110 talks during interval 312, and listens during interval 326. According to blocks 342 and 346, RFID tag 120 listens while reader 110 talks (during interval 312), and talks while reader 110 listens (during interval 326).

In terms of actual behavior, during interval 312 reader 110 talks to tag 120 as follows. According to block 352, reader 110 transmits signal 112, which was first described in FIG. 1. At the same time, according to block 362, tag 120 receives signal 112 and processes it to extract data and so on. Meanwhile, according to block 372, tag 120 does not backscatter with its antenna, and according to block 382, reader 110 has no signal to receive from tag 120.

During interval 326, tag 120 talks to reader 110 as follows. According to block 356, reader 110 transmits a Continuous Wave (CW) signal, which can be thought of as a carrier that typically encodes no information. This CW signal serves both to transfer energy to tag 120 for its own internal power needs, and also as a carrier that tag 120 can modulate with its backscatter. Indeed, during interval 326, according to block 366, tag 120 does not receive a signal for processing. Instead, according to block 376, tag 120 modulates the CW emitted according to block 356 so as to generate backscatter signal 126. Concurrently, according to block 386, reader 110 receives backscatter signal 126 and processes it.

FIG. 4 is a block diagram showing a detail of an RFID IC, such as IC 224 in FIG. 2. Electrical circuit 424 in FIG. 4 may be formed in an IC of an RFID tag, such as tag 220 of FIG. 2. Circuit 424 has a number of main components that are described in this document. Circuit 424 may have a number of additional components from what is shown and described, or different components, depending on the exact implementation.

Circuit 424 shows two IC contacts 432, 433, suitable for coupling to antenna segments such as segments 226 and 228 of RFID tag 220 of FIG. 2. When two IC contacts form the signal input from, and signal return to, an antenna they are often referred-to as an antenna port. IC contacts 432, 433 may be made in any suitable way, such as from metallic pads and so on. In some embodiments circuit 424 uses more than two IC contacts, especially when tag 220 has more than one antenna port and/or more than one antenna.

Circuit 424 also includes signal-routing section 435 which may include signal wiring, a receive/transmit switch that can selectively route a signal, and so on.

Circuit 424 also includes a rectifier and PMU (Power Management Unit) 441 that harvests energy from the RF signal received by antenna segments 226 and 228 to power the circuits of IC 424 during either or both reader-to-tag (R→T) and tag-to-reader (T→R) sessions. Rectifier and PMU 441 may be implemented in any way known in the art.

Circuit 424 additionally includes a demodulator 442 that demodulates the RF signal received via IC contacts 432, 433. Demodulator 442 may be implemented in any way known in the art, for example including a slicer, an amplifier, and so on.

Circuit 424 further includes a processing block 444 that receives the output from demodulator 442 and performs operations such as command decoding, memory interfacing, and so on. In addition, processing block 444 may generate an output signal for transmission. Processing block 444 may be implemented in any way known in the art, for example by combinations of one or more of a processor, memory, decoder, encoder, and so on.

Circuit 424 additionally includes a modulator 446 that modulates an output signal generated by processing block 444. The modulated signal is transmitted by driving IC contacts 432, 433, and therefore driving the load presented by the coupled antenna segment or segments. Modulator 446 may be implemented in any way known in the art, for example including a switch, driver, amplifier, and so on.

In one embodiment, demodulator 442 and modulator 446 may be combined in a single transceiver circuit. In another embodiment modulator 446 may modulate a signal using backscatter. In another embodiment modulator 446 may include an active transmitter. In yet other embodiments demodulator 442 and modulator 446 may be part of processing block 444.

Circuit 424 additionally includes a memory 450 to store data 452. At least a portion of memory 450 is preferably implemented as a Nonvolatile Memory (NVM), which means that data 452 is retained even when circuit 424 does not have power, as is frequently the case for a passive RFID tag.

In some embodiments, particularly in those with more than one antenna port, circuit 424 may contain multiple demodulators, rectifiers, PMUs, modulators, processing blocks, and/or memories.

In terms of processing a signal, circuit 424 operates differently during a R→T session and a T→R session. The different operations are described below, in this case with circuit 424 representing an IC of an RFID tag.

FIG. 5A shows version 524-A of components of circuit 424 of FIG. 4, further modified to emphasize a signal operation during a R→T session during time interval 312 of FIG. 3. Demodulator 442 demodulates an RF signal received from IC contacts 432, 433. The demodulated signal is provided to processing block 444 as C_IN. In one embodiment, C_IN may include a received stream of symbols.

Version 524-A shows as relatively obscured those components that do not play a part in processing a signal during a R→T session. Rectifier and PMU 441 may be active, such as for converting RF power. Modulator 446 generally does not transmit during a R→T session, and typically does not interact with the received RF signal significantly, either because switching action in section 435 of FIG. 4 decouples modulator 446 from the RF signal, or by designing modulator 446 to have a suitable impedance, and so on.

Although modulator 446 is typically inactive during a R→T session, it need not be so. For example, during a R→T session modulator 446 could be adjusting its own parameters for operation in a future session, and so on.

FIG. 5B shows version 524-B of components of circuit 424 of FIG. 4, further modified to emphasize a signal operation during a T→R session during time interval 326 of FIG. 3. Processing block 444 outputs a signal C_OUT. In one embodiment, C_OUT may include a stream of symbols for transmission. Modulator 446 then modulates C_OUT and provides it to antenna segments such as segments 226/228 of RFID tag 220 via IC contacts 432, 433.

Version 524-B shows as relatively obscured those components that do not play a part in processing a signal during a T→R session. Rectifier and PMU 441 may be active, such as for converting RF power. Demodulator 442 generally does not receive during a T→R session, and typically does not interact with the transmitted RF signal significantly, either because switching action in section 435 of FIG. 4 decouples demodulator 442 from the RF signal, or by designing demodulator 442 to have a suitable impedance, and so on.

Although demodulator 442 is typically inactive during a T→R session, it need not be so. For example, during a T→R session demodulator 442 could be adjusting its own parameters for operation in a future session, and so on.

In typical embodiments, demodulator 442 and modulator 446 are operable to demodulate and modulate signals according to a protocol, such as the Gen2 Specification referenced above. In embodiments where circuit 424 includes multiple demodulators and/or modulators, each may be configured to support different protocols or different sets of protocols. A protocol specifies, in part, symbol encodings, and may include a set of modulations, rates, timings, or any other parameter associated with data communications.

In the above, an RFID reader/interrogator may communicate with one or more RFID tags in any number of ways. Some such ways are described in protocols. A protocol is a specification or industry standard that calls for specific manners of signaling between the reader and the tags. For example, the Gen2 Specification referenced above is one such protocol. In addition, a protocol can be a variant of a stated specification such as the Gen2 Specification, for example including fewer or additional commands than the stated specification calls for, and so on. In such instances, additional commands are sometimes called custom commands.

In many cases RFID ICs can be placed onto an inlay with relatively good placement accuracy. Accurate alignment of an IC to an inlay antenna allows proper coupling between the IC contacts and the antenna terminals. One way to couple the IC to the antenna terminals involves using metallic posts, also known as bumps. However, in some situations using bumps for coupling may be undesirable. Bumps form a stress point on the IC, reducing its strength and potentially resulting in IC breakage during further processing.

Figure 6:
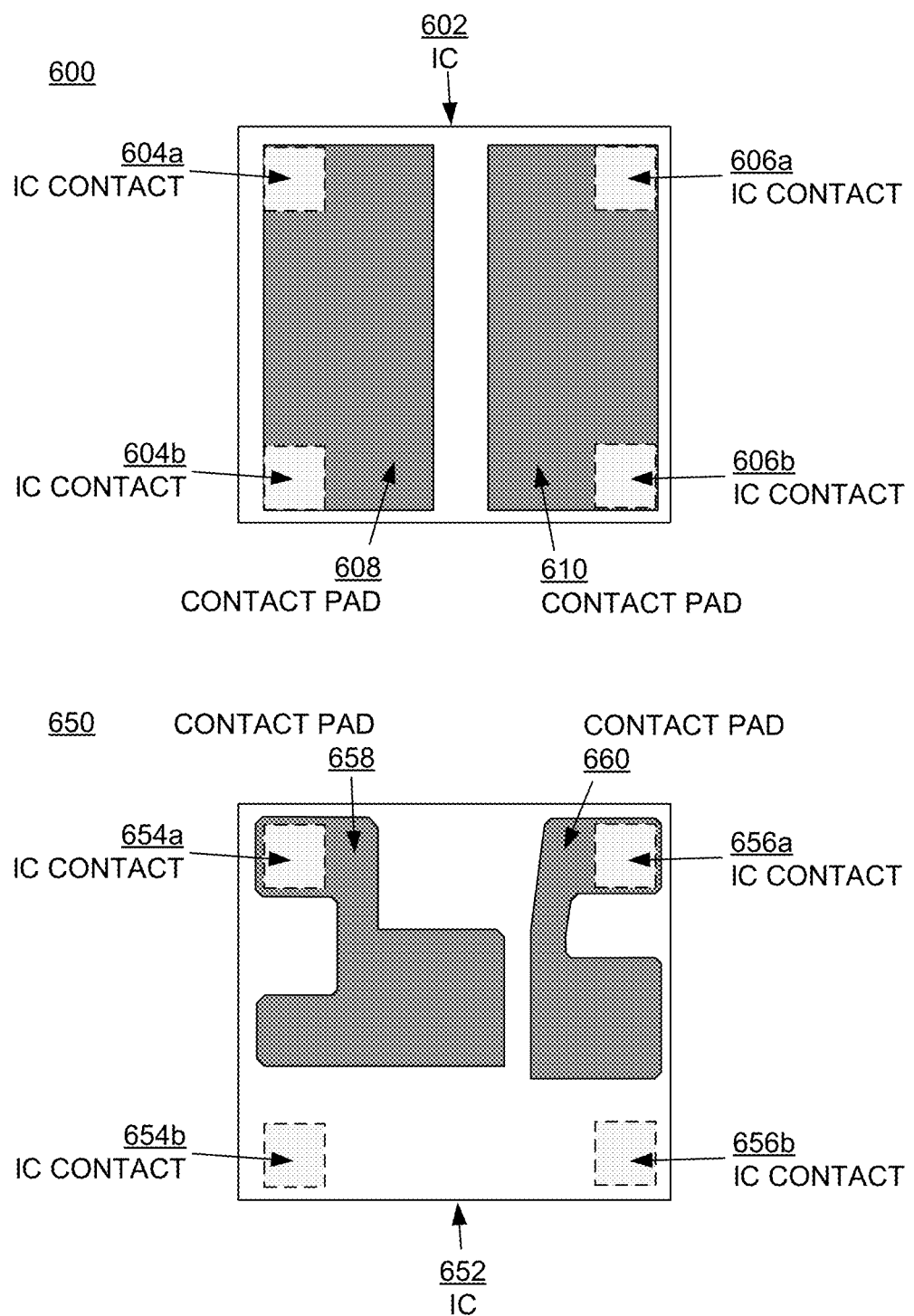
FIG. 6 depicts patterned contact pads according to embodiments.

In some embodiments, one or more relatively large conductive contact pads formed on the IC may be used instead of (or in addition to) bumps. Diagram 600 in FIG. 6 depicts a top view of IC 602 having large contact pads 608 and 610. In diagram 600 each large contact pad is electrically coupled to IC 602 via a pair of IC contacts, but more or fewer IC contacts can be used. In some embodiments the large contract pads 608 and 610 are galvanically coupled to the IC contacts, whereas in other embodiments the coupling may be capacitive or inductive.

As depicted in diagram 600, large contact pad 608 is electrically coupled to IC 602 via IC contacts 604a and 604b, and large contact pad 610 is electrically coupled to IC 602 via IC contacts 606a and 606b. Large contact pads 608 and 610 are, in turn, configured to provide capacitive or galvanic coupling to external electrical elements such as the antenna terminals on an RFID strap or inlay. Large contact pads 608 and 610 provide more area for coupling to these external electrical elements, and as a result reduce the coupling impedance. They also reduce performance variations due to IC-to-antenna alignment accuracy because the predominant parasitic capacitive coupling is IC-to-contact pad rather than IC-to-antenna, and the IC-to-contact-pad alignment is typically very well controlled because the large contact pads are fabricated on IC 602.

In some embodiments, a dielectric or repassivation layer is first deposited on IC 602, and large contact pads 608/610 are formed on the repassivation layer and then electrically coupled to the IC contacts. The coupling between the large contact pads and the IC contacts may be capacitive or galvanic. When capacitive, the coupling may be adjusted via the dielectric characteristics (e.g. composition, thickness) of the material disposed between the contact pads and the antenna. This material may be nonconductive material covering the pads, nonconductive material covering the antenna traces (e.g. a naturally grown or enhanced oxide layer on aluminum traces), and/or any additional dielectric material. Galvanic coupling may be enhanced by pressing an antenna onto the IC such that one or more "dimples" formed on the antenna make direct contact with one or more of the large contact pads on the IC. In some embodiments, the dimples are instead formed on the large contact pads. In some embodiment the dimples break through the nonconductive covering material. In other embodiments, galvanic coupling may be accomplished without dimples or bumps, such as by direct contact or by means of an etchant to remove the nonconductive covering material.

Large contact pads 608/610 may cover a significant portion of the top surface of IC 602. For example, large contact pads 608/610 may cover more than 20%, 30%, 40%, 50%, 60%, 70%, 80%, 90%, or even up to 100% of the top surface of IC 602. Regardless of the amount of coverage, large contact pads 608/610 are distinguishable from bumps by their predisposition to have at least one of (1) a surface area that is a significant fraction of the size of underlying IC 602, (2) a surface area that is many times larger than that of the underlying IC contacts, (3) a low aspect ratio (height versus width or height versus surface area), and/or (4) a flat or textured-flat top. By contrast, bumps typically have (1) a surface area that is small relative to the size of underlying IC 602, (2) a surface area that is similar or perhaps twice that of the underlying IC contacts, (3) a high aspect ratio (height versus width or height versus surface area), and (4) a rounded top. In addition, large contact pads 608/610 tend to have an as-designed shape, whereas bumps tend to assume a shape similar that of their underlying IC contacts (i.e. circular-looking if the underlying bumps are circular or octagonal-looking if the underlying IC contacts are octagonal). Of course, not all of these differences are required or absolute, but a large contact pad is easily distinguishable from a bump by one of ordinary skill in the art.

In some embodiments, large contact pads on a surface of an IC are confined within or extend up to that surface's perimeter. In other embodiments, large contact pads may extend out beyond the perimeter of an IC surface and may wrap around or encroach onto neighboring IC surfaces, or even extend outward from the IC surface in a cantilevered fashion.

Whereas large contact pads 608/610 in diagram 600 are shown as substantially rectangular, large contact pads do not need to be rectangular. Large contact pads may be circular, annular, or may be designed to have any suitable shape. Diagram 650 depicts a top view of IC 652 with one IC contact pair having contacts 654a and 654b (similar to contacts 604a and 604b) and another IC contact pair having contacts 656a, 656b (similar to contacts 606a and 606b). Large contact pads 658 and 660 overlie and electrically couple to IC contacts 654a and 656a, respectively. IC contact pads 654b and 656b may remain electrically isolated, may couple to other electrical elements, may have any other purpose, or may not even exist.

Large contact pads 658 and 660 may be fabricated and shaped by patterning a deposited conductive layer. The shapes and/or orientations of the contact areas may be based on aesthetics, ease of electrically coupling to antenna terminals, ease of etching or forming, utility as an etch-stop in an etching step, reducing parasitic coupling to sensitive components in IC 602/652, or for any other reason. In some embodiments large contact pads may be patterned so that regions whose local parasitic capacitance to IC 602/652 (or elements in IC 602/652) would exceed a threshold are excised. The portions may be removed after deposition or may not be deposited in the first place. The threshold(s) may be determined based on, for example, a desired parasitic capacitance of the entire IC or a desired local parasitic capacitance of a portion of the IC. Also as shown in diagram 650, contact pads 658 and 660 may have curved or rounded edges, for example to ease masking, etching, and/or liftoff patterning processes.

The surface area of a large contact pad that is available for electrical coupling to an antenna may be much larger than the surface area of the interface between the contact pad and the IC contact. For example, the surface area of large contact pad 608 is shown to be substantially larger than the total surface area of the interface between large contact pad 608 and IC contacts 604a and 604b. Likewise, the surface area of large contact pad 610 is shown to be substantially larger than the total surface area of the interface between large contact pad 610 and IC contacts 606a and 606b. In some embodiments, the surface area of a large contact pad available for electrical coupling to an antenna may be at least three times (300%), five times (500%), ten times (1000%), or even twenty times (2000%) or more larger than the surface area of the interface between the large contact pad and one or more IC contacts.

FIG. 7 illustrates detailed cross-sections of RFID ICs with large contact pads electrically coupling to antennas according to embodiments. Cross-sections 700 and 750 depict an RFID strap or inlay with substrate 722, antenna 726, and RFID IC 724. Repassivation layer 730, contact pad 734, and optional conductive/nonconductive layer or adhesive 736 are disposed between antenna 726 and RFID IC 724.

Repassivation layer 730 is nonconductive, and may be used to reduce variations in mounting capacitance by ensuring a fixed distance between circuits of IC 724 and antenna 726. One or more edges of repassivation layer 730 may be sloped or beveled, as depicted in FIG. 7. A "sloped" or "beveled" surface or edge as used herein is a surface that is substantially nonvertically-sloped with respect to a corresponding surface of an associated IC. A substantially nonvertical slope may be relatively steep (i.e., having an angle of inclination with respect to the IC surface of 50, 60, 70, or 80 degrees), relatively shallow (i.e., having an angle of inclination with respect to the IC surface of 10, 20, 30, or 40 degrees), or somewhere in between. In other embodiments one or more repassivation layer edges may be substantially vertical (i.e., forming an angle of substantially 90° with respect to the IC surface). Repassivation layer 730 may be an organic or inorganic material, typically (although not necessarily) with a relatively low dielectric constant and a reasonable thickness to minimize parasitic coupling capacitance. Examples of organic materials include but are not limited to polyimide-based materials, Spheron™ WLP manufactured by RoseStreet Labs based in Phoenix, Ariz., or benzocyclobutene-based materials (e.g., bisbenzocyclobutene, BCB). In some embodiments, repassivation layer 730 may include an air gap that separates contact pad 734 from IC 724 to assist in capacitively decoupling the two. The air gap may be bridged by support pillar(s) between contact pad 734 and IC 724 (including contacts that electrically couple the two).

Contact pad 734 (also known as a conductive redistribution layer) may be a large contact pad as described above, and is used to facilitate electrical coupling between antenna 726 and IC contact 733 of IC 724. Contact pad 734 may be metal (e.g., copper, aluminum, gold, palladium, or any other suitable metal), doped silicon, graphene, or another material that is electrically conductive or possesses metallic properties, and may be applied or deposited on repassivation layer 730, for example by evaporation, sputtering, or direct transfer. Contact pad 734 may cover a large portion of the surface of either RFID IC 724 or repassivation layer 730, and may comprise a single or multiple portions. For example, contact pad 734 on repassivation layer 730 may be patterned to provide multiple contact areas electrically isolated from each other. In some embodiments, contact pad 734 may employ a mesh structure to reduce capacitive coupling between the contact pad 734 and IC 724.

In some embodiments, contact pad 734 may help to protect underlying portions of repassivation layer 730 during IC fabrication. For example, contact pad 734 may serve as an etch mask that covers and prevents etching or damage to underlying portions of repassivation layer 730 during processing like that described in U.S. Pat. No. 7,482,251 issued on Jan. 27, 2009, the entirety of which is hereby incorporated by reference.

In some embodiments, an additional layer 736 may be used to physically and/or electrically attach IC 724 to the substrate 722 and/or antenna 726. Layer 736 may include an anisotropic conductive adhesive or layer, a patterned conductive adhesive or layer, and/or a nonconductive adhesive or layer. If layer 736 is nonconductive then it is typically sufficiently thin as to provide low-impedance capacitive coupling between antenna 726 and contact pad 734 at the frequencies of RFID communications. In some embodiments layer 736 may be patterned to prevent different terminals of antenna 726 or portions of contact pad 734 from coupling with each other. For example, layer 736 may be patterned such that a portion of contact pad 734 only galvanically couples with one terminal of antenna 726, and does not galvanically couple with other terminals of antenna 726 or with other portions of contact pad 734. Of course, in some embodiments layer 736 may not be present at all.

Contact pad 734, as described above, facilitates electrical coupling between antenna 726 and IC contact 733. IC contact 733, in turn, electrically couples to circuits 728 within IC 724, such as the circuits and circuit blocks described above in FIG. 4. Contact pad 734 may electrically couple to IC contact 733 through and/or around repassivation layer 730. In cross-section 700, through-contact 732 electrically couples contact pad 734 to IC contact 733 through repassivation layer 730. Through-contact 732 is formed of a conductive (e.g., metallic) material, thereby galvanically (or conductively) coupling contact pad 734 to IC contact 733, and may be deposited or applied in a hole or aperture formed in repassivation layer 730. Through-contact 732 may be formed as part of contact pad 734 (for example, formed as a result of the deposition of contact pad 734 over an aperture in repassivation layer 730), or may be formed as a separate structure or bump (for example, applied or deposited in an aperture in repassivation layer 730 before contact pad 734 is deposited).

In another embodiment, depicted in diagram 750, repassivation layer 730 may leave a portion of IC contact 733 uncovered. Contact pad 734 may then be disposed on IC 724 so as to extend from the top of repassivation layer 730 down its sloped/beveled side, forming a side-contact 752. Side-contact 752 may further extend beyond the periphery of repassivation layer 730 and over at least a portion of IC contact 733, thereby coupling contact pad 734 galvanically or capacitively to IC contact 733. In some embodiments the extension of side-contact 752 may couple to IC contact 733 directly, without intermediate contacts, bumps, or layers. In other embodiments one or more conductive and/or nonconductive contacts, bumps or layers may be interposed between the extension of side-contact 752 and IC contact 733.

Contact pad 734 also electrically couples to antenna 726 directly or through an optional conductive/nonconductive layer or adhesive 736, as described above. In some embodiments, in particular those similar to diagram 750, the region of electrical coupling between contact pad 734 and antenna 726 substantially nonoverlaps the region of electrical coupling between contact pad 734 and IC contact 733. In other words, the projection of the electrical interface area between contact pad 734 and antenna 726 onto the surface of the IC 724 does not overlap the projection of the electrical interface area between contact pad 734 and IC contact 733.

Repassivation layer 730 and/or contact pad 734 may be deposited or processed to have a particular pattern. For example, repassivation layer 730 may have a pattern of any desired shape that uncovers all or a portion of IC contacts 733, uncovers other portions of the surface of IC 724, and/or covers an entire surface of IC 724. Similarly, contact pad 734 may be further patterned to form contact strips or any other desired shape, and may cover all or a portion of IC contacts 733. The patterning of repassivation layer 730 and/or contact pad 734 may be performed using a masking step to define the desired pattern (e.g., with a masking layer) and an etching step (if masking occurs after layer deposition) or a liftoff/removal step (if masking occurs before layer deposition). In some embodiments, repassivation layer 730 and/or contact pad 734 may be applied to another substrate, optionally patterned, and then transferred to IC 724.

As described above, repassivation layer 730 may have a pattern that uncovers at least a portion of IC contacts 733. For example, repassivation layer 730 may be patterned to leave openings over at least a portion of IC contacts 733, or may be patterned such that at least a portion of IC contacts 733 lie outside the periphery of repassivation layer 730. By contrast, contact pad 734 may have a pattern that covers at least a portion of IC contacts 733. In some embodiments, a first pattern of repassivation layer 730 and a second pattern of contact pad 734 may be chosen such that the portions of IC contacts 733 uncovered by the first pattern at least partially coincide with the portions of IC contacts 733 that are covered by the second pattern.

Contact pad 734 may be galvanically (i.e., conductively) connected to the portion(s) of IC contacts 733 uncovered by the first pattern and covered by the second pattern. In some embodiments, the second pattern may be deposited directly over portions of IC contacts 733 uncovered by the first pattern and processed to form galvanic connections to IC contacts 733 without bumps or other intermediaries. For example, contact pad 734 may be deposited over openings in repassivation layer 730 that uncover portions of IC contacts 733, or may be deposited to extend beyond the periphery of repassivation layer 730 if portions of IC contacts 733 lie outside the periphery of repassivation layer 730, thereby forming one or more side-contacts. In other embodiments one or more through-contacts may galvanically connect a contact pad to one or more IC contacts.

In some embodiments, IC contacts 733 may be electrically coupled to contact pad 734 without uncovering portions of IC contacts 733. For example, portions of repassivation layer 730 may be made conductive, for example by doping via ion implantation, allowing IC contacts 733 to galvanically connect with contact pad 734 through these conductive portions. In another example, IC contacts 733 may capacitively couple to contact pad 734 through repassivation layer 730.

In some embodiments, an RFID inlay may be assembled by pressing an RFID IC and an antenna-bearing substrate together, optionally with an interposing adhesive, such that the IC electrically couples to the antenna on the substrate. In some situations, the substrate may flex due to the force used during the pressing process, causing the substrate to bend around edges of the IC.

Figure 8:
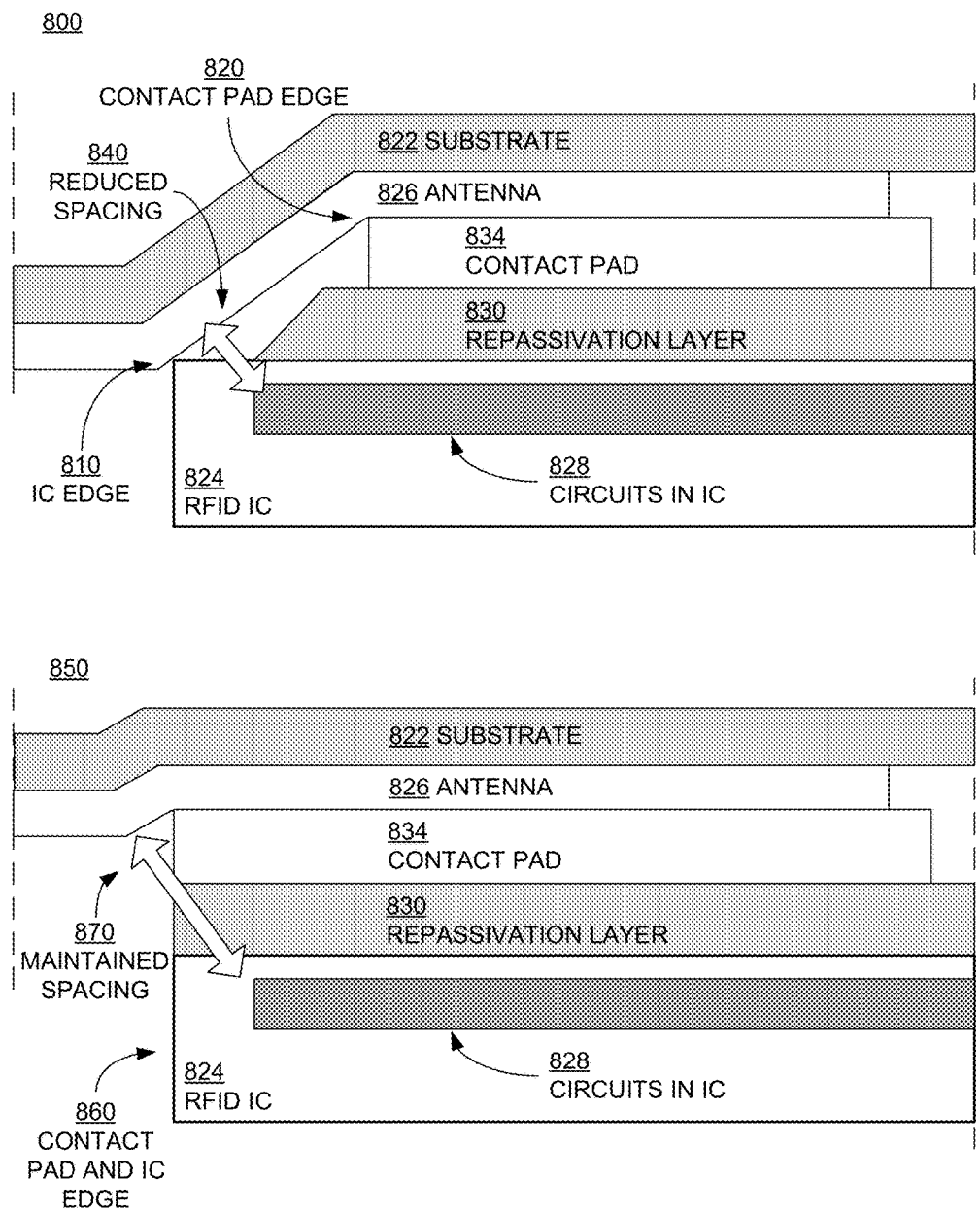
FIG. 8 illustrates substrate deformation resulting from IC attachment according to embodiments.

FIG. 8 illustrates substrate deformation resulting from IC attachment according to embodiments. Diagrams 800 and 850 depict an inlay with substrate 822, antenna 826, and RFID IC 824. Repassivation layer 830 and contact pad 834 are disposed between antenna 826 and IC 824. Although diagrams 800 and 850 are described in the context of inlays, in some embodiments substrate 822 may be a strap, in which case antenna 826 may correspond to an electrical lead or strap contact.

In diagram 800 as shown, repassivation layer 830 does not extend to edge 810 of IC 824, and contact pad 834 does not extend to the edge of repassivation layer 830. As a result, the inlay assembly process may deform substrate 822 and antenna 826 around contact pad edge 820 such that substrate 822 and antenna 826 bend toward IC 824. This may result in reduced spacing 840 between antenna 826 and circuits 828 in IC 824, which may lead to undesired electrical coupling or interference between antenna 826 and circuits 828.

In contrast, diagram 850 depicts repassivation layer 830 and contact pad 834 both extending to edge 860 of IC 824. For example, contact pad 834 may serve as an etch-stop, preventing damage or removal of underlying portions of repassivation layer 830. As a result, bending of substrate 822 and antenna 826 due to the inlay assembly process occurs at the extended edge of contact pad 834, resulting in maintained spacing 870 between antenna 826 and circuits 828 instead of reduced spacing 840. Of course, while repassivation layer 830 and contact pad 834 extend to edge 860 of IC 824, in other embodiments repassivation layer 830 and/or contact pad 834 may extend past edge 860 of IC 824. For example, repassivation layer 830 may extend past edge 860 with contact pad 834 extending to the edge of repassivation layer 830, or repassivation layer 830 may extend to edge 860 while contact pad 834 extends past edge 860. In some embodiments, repassivation layer 830 may provide an extended edge for substrate 822 and antenna 826 to bend around for maintained spacing 870. For example, contact pad 834 may or may not extend to edge 860, but repassivation layer 830 may extend sufficiently to or past edge 860 to result in maintained spacing 870. In some embodiments, maintained spacing between antenna 826 and circuits 828 may be achieved with a raised structure at the IC edge. The raised structure may be part of contact pad 834 and/or repassivation layer 830, or may be a separately-fabricated structure, such as a bump or ridge.

Figure 9:
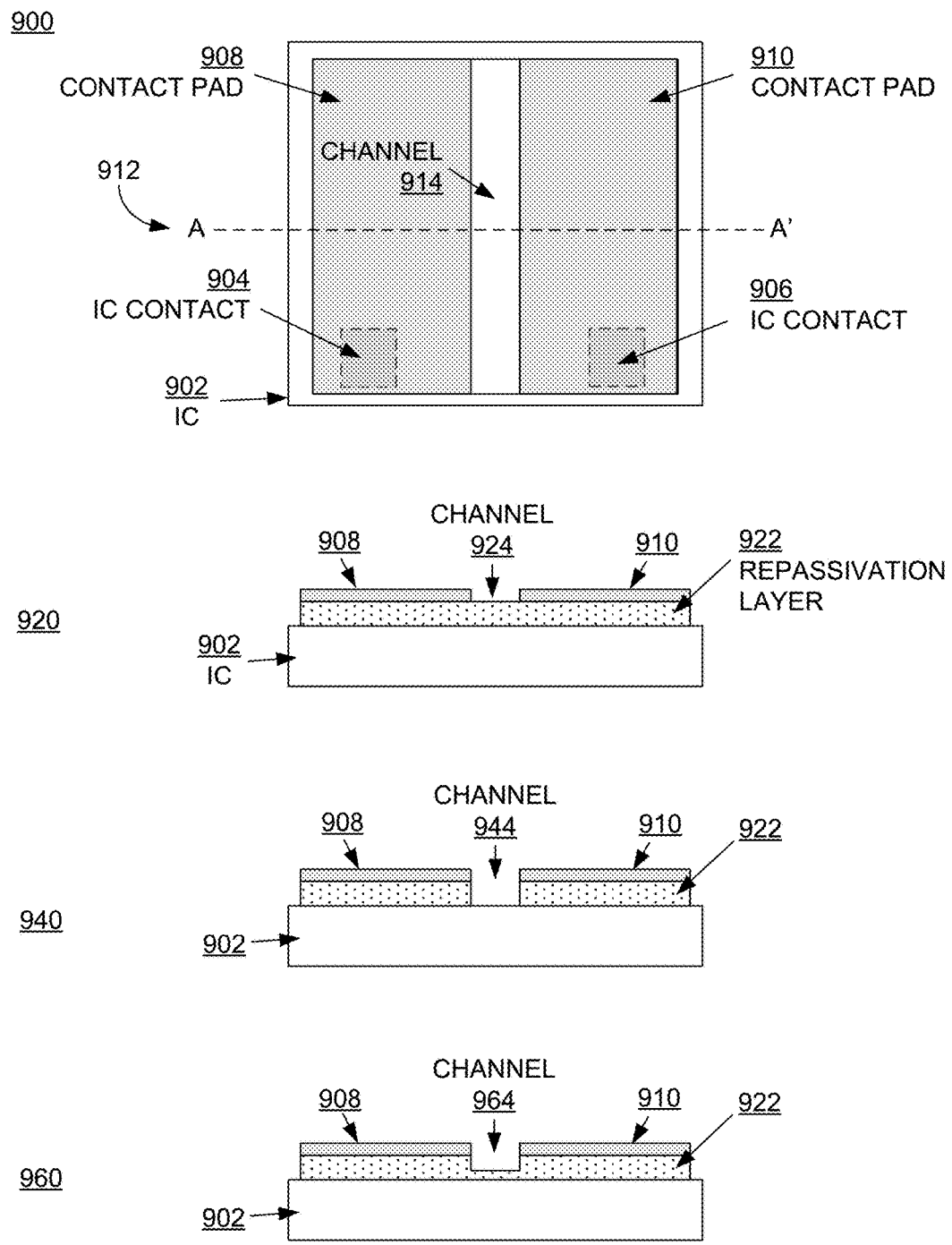
FIG. 9 depicts an RFID IC with a channel between contact pads, according to embodiments.

FIG. 9 depicts a top-down view 900 of an RFID IC 902 with a channel between contact pads according to embodiments. IC 902 includes IC contacts 904 and 906, repassivation layer 922 disposed on its top surface, and contact pads 908 and 910 disposed on repassivation layer 922 and electrically coupled to IC contacts 904 and 906, respectively. Channel 914 separates at least contact pad 908 from contact pad 910, and may be formed using any suitable process. In one embodiment, channel 914 may be formed by depositing a masking layer (e.g., a photoresist), developing the masking layer to expose a region corresponding to channel 914, and then etching the exposed region away, for example using dry etching, wet etching, or a combination. In another embodiment, contact pads 908 and 910 may be used as the masking layers, and portions of repassivation layer 922 (including the portion corresponding to the region of channel 914) may be removed using an etching process or as a byproduct of another fabrication process, such as a mask-stripping process. In other embodiments, channel 914 may be cut using a saw, laser, or any other suitable means.

While contact pads 908 and 910 are depicted as substantially covering the top surface area of repassivation layer 922 with the exception of channel 914, in other embodiments contact pads 908/910 may only cover a majority (i.e., greater than half or 50%) or even a minority (i.e., less than half or 50%) of the top surface area of repassivation layer 922. In some embodiments, contact pads 908/910 may extend beyond the perimeter of repassivation layer 922, for example cantilevering out past at least one edge of repassivation layer 922 or folding down and covering at least a portion of a side surface of repassivation layer 922. While repassivation layer 922 is depicted as having substantially vertical sides, in some embodiments one or more sides of repassivation layer 922 may be beveled inward or outward.

Cross-section views 920, 940, and 960, all taken from section A-A' of IC 902, depict IC 902 with different channel embodiments. Cross-section view 920 depicts IC 902 and a transverse cross-section view of a first channel embodiment, denoted as channel 924. Channel 924 may have a depth substantially equivalent to the height of contact pads 908/910, and repassivation layer 922 may form its bottom. Channel 924 may be formed by depositing a single conductive layer and then etching channel 924 to form contact pads 908 and 910, or may be formed as a result of the separate formation of contact pads 908 and 910. The sides of channel 924 may be vertical, substantially vertical, beveled inward, or beveled outward.

Cross-section view 940 depicts IC 902 and a transverse cross-section view of a second channel embodiment, denoted as channel 944. Channel 944 may have a depth substantially equivalent to the height of contact pads 908/910 and repassivation layer 922. In some embodiments, channel 944 may be formed by first forming a shallow channel, such as channel 924, and then subsequently removing portions of repassivation layer 922 underlying the shallow channel until the surface of IC 902 is reached. In other embodiments, repassivation layer 922 may be formed in multiple portions, with channel 944 separating the portions, and contact pads 908 and 910 subsequently deposited on the repassivation layer portions. The sides of channel 944 may be vertical, substantially vertical, beveled inward, or beveled outward.

Cross-section view 960 depicts IC 902 and a transverse cross-section view of a third channel embodiment, denoted as channel 964. Channel 964 may have a depth greater than the height of contact pads 908/910 but less than the combined height of repassivation layer 922 and contact pads 908/910. In some embodiments, channel 964 may be formed by first forming a shallow channel, such as channel 924, and then subsequently removing portions of repassivation layer 922 underlying the shallow channel until the desired channel depth is reached. The sides of channel 964 may be vertical, substantially vertical, beveled inward, or beveled outward.

Channels 914, 924, 944, and 964 separate contact pads 908 and 910, and as such may have lengths that correspond to the size of contact pads 908/910. For example, if contact pads 908 and 910 substantially span the entire width (or length) of the top surface of IC 902, then channels 914/924/944/964 may have lengths that also substantially span the entire width or length of the top surface of IC 902. In some embodiments, channels 914/924/944/964 may not span the entire width or length of the top surface of IC 902, and may instead only span a majority (i.e., greater than half or 50%) or even a minority (i.e., less than half or 50%) of the entire width or length of the top surface of IC 902.

Figure 10:
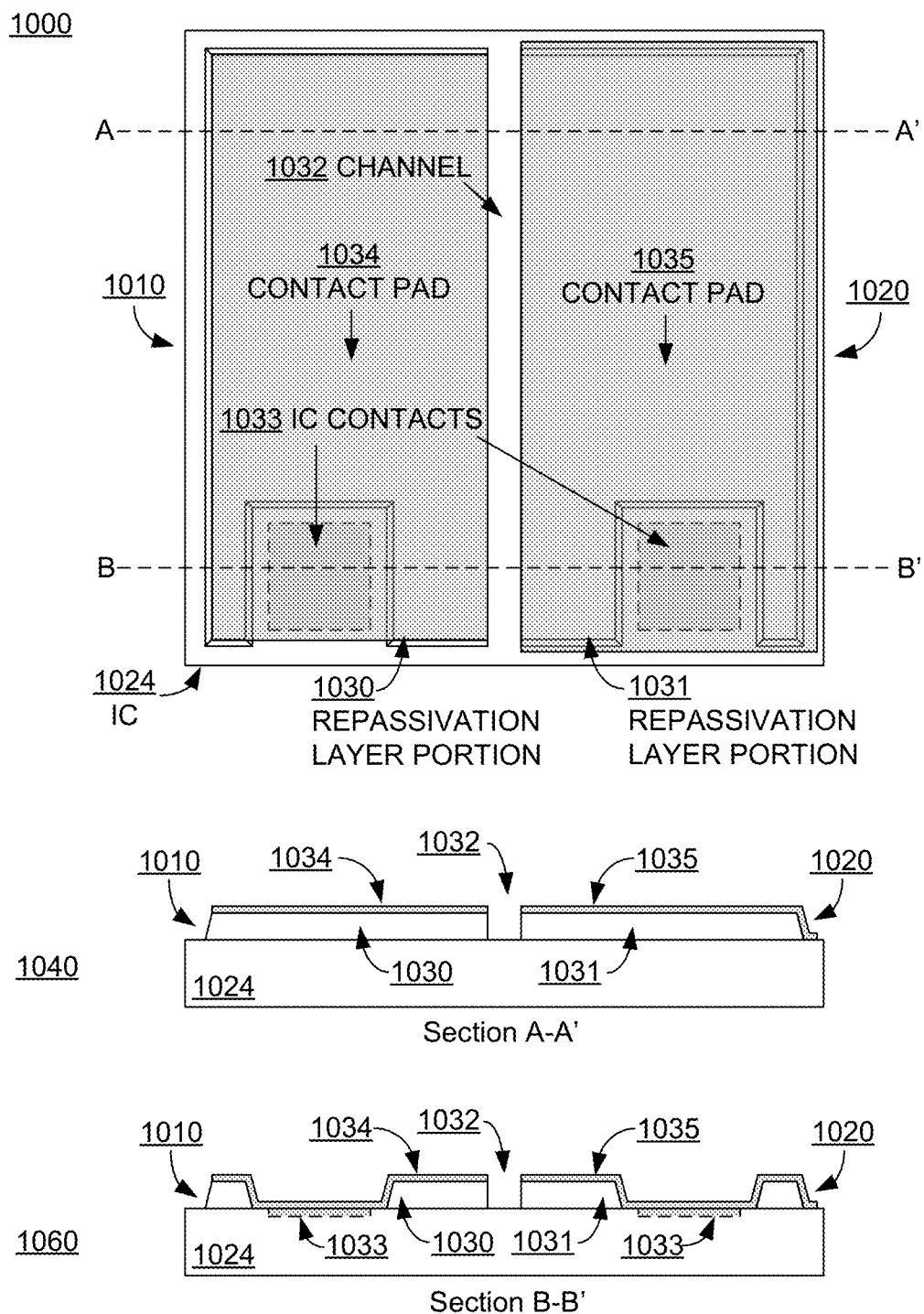
FIG. 10 illustrates RFID IC contact pad configurations according to embodiments.

FIG. 10 illustrates a top-down view 1000 and cross-section views 1040 and 1060 of RFID IC contact pad configurations according to embodiments. IC 1024 includes IC contacts 1033 and has repassivation layer portions 1030/1031 and contact pads 1034/1035 disposed on its top surface. The repassivation layer portions 1030 and 1031 may be created separately (for example, from different deposition processes or from a single, masked deposition process), or may be created by forming channel 1032 in a single repassivation layer. Each of the portions 1030 and 1031 has at least one edge that is near vertical (the edges nearest channel 1032) and at least one other edge that is beveled, either inward or outward. Channel 1032 may result from the separate formation of repassivation layer portions 1030 and 1031 or by removal of material from a single repassivation layer. While in FIG. 10 channel 1032 is depicted as having vertical or near-vertical sides, in other embodiments channel 1032 may have beveled or sloped sides.

As depicted in FIG. 10, repassivation layer portions 1030 and 1031 may only partially cover the top surface of IC 1024, leaving portions of the IC surface at channel 1032, around the peripheries of portions 1030 and 1031, and over IC contacts 1033 uncovered. In some embodiments, a repassivation layer portion such as portions 1030 and 1031 may extend entirely to one or more edges of an IC surface but not extend entirely to one or more other edges of the IC surface. In other embodiments, a repassivation layer portion may extend entirely to all edges of an IC surface. A repassivation layer portion may be confined within the perimeter of an IC surface, or may extend beyond the perimeter of the IC surface. In some embodiments, the parts of a repassivation layer portion that extend beyond a perimeter of the underlying surface may be removed by stripping, etching, or as a by-product of IC singulation.

Contact pads 1034 and 1035 cover and directly contact IC contacts 1033, as depicted in cross-section view 1060, and may also cover the majority of the top surfaces of repassivation layer portions 1030 and 1031, respectively. Contact pads such as contact pads 1034 and 1035 may be confined within the perimeter of an underlying surface (for example, the surface of an underlying repassivation layer or the IC itself), or may extend beyond the perimeter of an underlying surface. The parts of contact pads that extend beyond a perimeter of the underlying surface may be removed, if desired, by stripping, etching, or as a by-product of IC singulation.

Cross-section view 1040 is taken from section A-A' as labeled in view 1000, and depicts contact pads 1034 and 1035 disposed on repassivation layer portions 1030 and 1031, respectively. Contact pad 1034 covers the majority of the top surface of repassivation layer portion 1030, but does not extend down the beveled side 1010 of repassivation layer portion 1030 or the near-vertical side of repassivation layer portion 1030 adjacent to channel 1032. Contact pad 1035 also covers the majority of the top surface of repassivation layer portion 1031 and does not extend down the near-vertical side of repassivation layer portion 1031 adjacent to channel 1032. However, contact pad 1035 does extend down and cover the beveled side 1020 of repassivation layer portion 1031. Furthermore, contact pad 1035 may extend to cover a portion of the IC surface exposed by repassivation layer portion 1031, as depicted in FIG. 10, although in other embodiments contact pad 1035 may cover the beveled side 1020 while not extending to cover exposed portions of the IC surface. In embodiments where channel 1032 has beveled sides, contact pads 1034 and/or 1035 may (similar to side 1020) or may not (similar to side 1010) extend down the beveled sides of channel 1032.

Cross-section view 1060 is taken from section B-B' as labeled in view 1000, and depicts contact pads 1034 and 1035 disposed on repassivation layer portions 1030 and 1031, respectively, as well as IC contacts 1033. Similar to cross-section view 1040, contact pads 1034 and 1035 cover the majority of the top surfaces of repassivation layer portions 1030 and 1031, respectively. In addition, contact pads 1034 and 1035 extend down and cover the beveled sides of the repassivation layer portions 1030 and 1031 surrounding IC contacts 1033, forming side-contacts that electrically couple contact pads 1034 and 1035 with IC contacts 1033.

Figure 11:
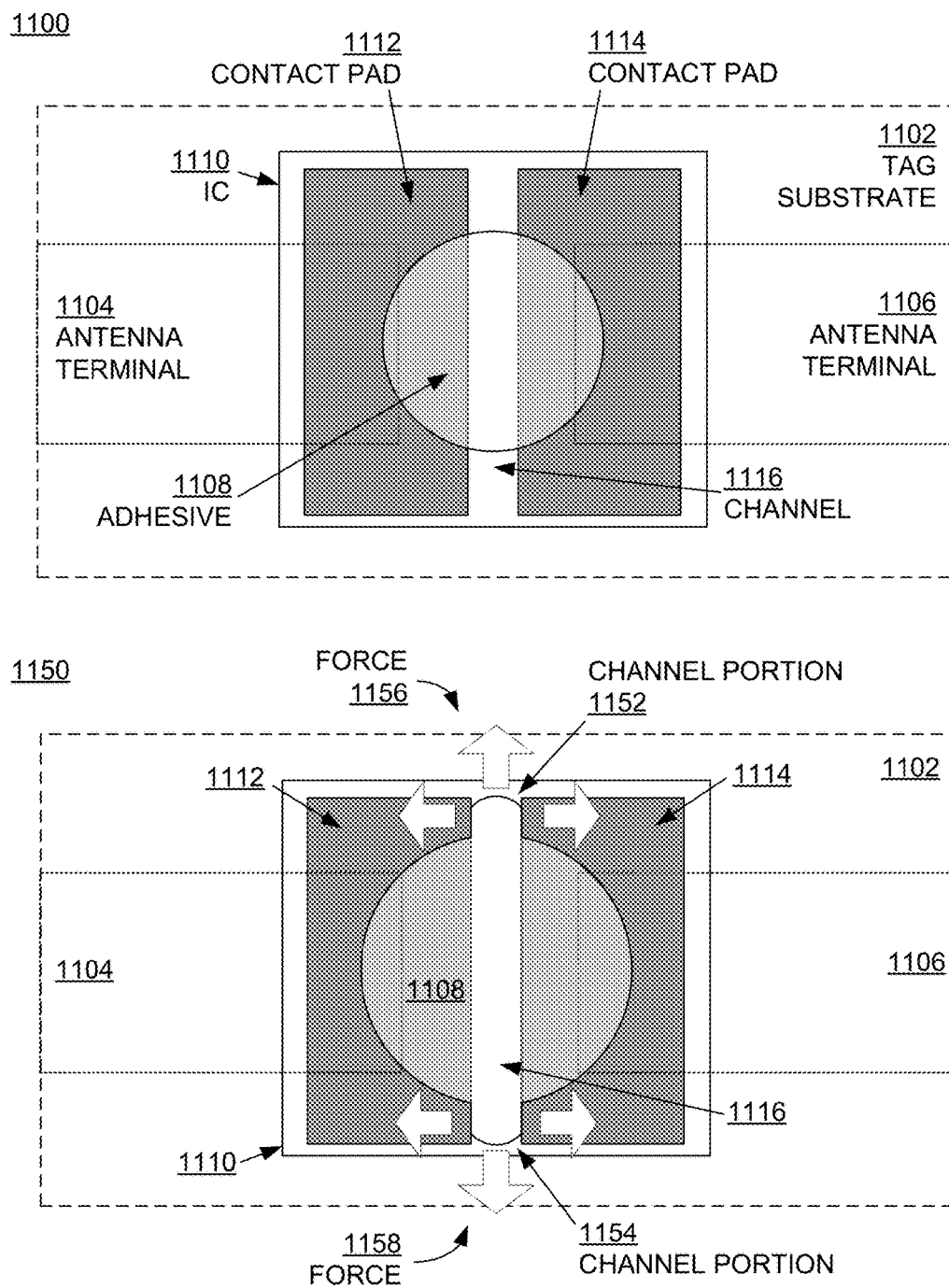
FIG. 11 depicts liquid adhesive propagation during IC attachment to a tag substrate according to embodiments.

While FIG. 10 depicts contact pads on the same IC that differ in their coverage of the beveled sides of repassivation layer portions and of exposed portions of the IC surface, in other embodiments contact pads on the same IC may have similar coverage. For example, all the contact pads on an IC may be similar to contact pad 1034 in terms of coverage (i.e., leaving beveled sides of repassivation layer portions uncovered), or may be similar to contact pad 1035 in terms of coverage (i.e., covering beveled sides of repassivation layer portions and optionally covering some exposed portions of the IC surface). In some embodiments, a particular contact pad may provide different coverage at different edges. For example, a particular contact pad may have at least one edge that does not extend over and cover the corresponding beveled side of the underlying repassivation layer portion, and may have at least one other edge that does extend over and cover the corresponding beveled side of the underlying repassivation layer portion. In some embodiments, a liquid or partially liquid adhesive may be used to facilitate the attachment of an RFID IC to an inlay or strap. FIG. 11 depicts liquid adhesive propagation through IC attachment to a tag substrate according to embodiments. Diagram 1100 depicts an IC 1110 and tag substrate 1102. IC 1110 includes contact pad 1112, contact pad 1114, and channel 1116 separating the contact pads. Channel 1116 may have a depth substantially equal to the height of contact pads 1112/1114, or may extend into an underlying layer, such as a repassivation layer (for example, as depicted in FIG. 9). Tag substrate 1102 includes antenna terminals 1104 and 1106. IC 1110 is initially aligned to tag substrate 1102 such that contact pads 1112 and 1114 can electrically couple to antenna terminals 1104 and 1106, respectively. Adhesive 1108, disposed between IC 1110 and tag substrate 1102, may be used to physically attach IC 1110 to tag substrate 1102. Subsequently, IC 1110 and tag substrate 1102 may be pressed together to ensure that contact pads 1112/1114 and antenna terminals 1104/1106 are close enough for electrical coupling. In some embodiments, adhesive 1108 may assist in the electrical coupling of contact pads 1112/1114 and antenna terminals 1104/1106. For example, adhesive 1108 may be isotropically conductive, anisotropically conductive, or a dielectric (for capacitive coupling). In some embodiments, adhesive 1108 may be further cured, for example via application of heat, light, and/or pressure.

In situations where adhesive 1108 is initially a liquid, adhesive 1108 may spread across IC 1110 when IC 1110 and tag substrate 1102 are pressed together, as depicted in diagram 1150. For example, adhesive 1108 may propagate through channel 1116 and across the surfaces of contact pads 1112 and 1114. In some embodiments, adhesive 1108 may preferentially propagate through channel 1116, due to the increased transverse cross-sectional area provided by channel 1116. During propagation through channel 1116, adhesive 1108 may exert lateral force on the sides of channel 1116 and therefore on IC 1110. For example, adhesive 1108 may exert force 1156 during propagation through channel portion 1152 and may exert force 1158 during propagation through channel portion 1154. Forces 1156 and 1158, denoted by white block arrows, may be exerted by adhesive 1108 in any suitable direction, and may result from the interaction of the propagating adhesive with the surfaces of contact pads 1112/1114, the walls of channel 1152, the bottom of channel 1152, and the corresponding surfaces of tag substrate 1102 and/or antenna terminals 1104/1106.

In the event that adhesive 1108 is unevenly applied, or the force used to press IC 1110 and tag substrate 1102 together is not distributed evenly, adhesive 1108 may propagate unevenly. For example, adhesive 1108 may propagate at one velocity through channel portion 1152 and propagate at a different velocity through channel portion 1154. As another example, adhesive 1108 may propagate faster through one side of channel 1116 (for example, the left side) than the other side. Moreover, even if adhesive propagation through channel 1116 is relatively even, fluid turbulence may result from adhesive flow through the relatively close confines of channel 1116.

If adhesive 1108 propagates unevenly, or if significant turbulence occurs in channel 1116, adhesive 1108 may at times exert uneven or unbalanced forces on IC 1110 and/or tag substrate 1102. For example, force 1156 may differ from force 1158 in magnitude and/or direction at some particular point in time. As a result, IC 1110 may rotate and/or displace relative to tag substrate 1102. When such rotations and displacements accumulate over time, IC 1110 may become misaligned with respect to tag substrate 1102. This may be particularly problematic if the misalignment results in loss of electrical coupling between contact pads 1112/1114 and antenna terminals 1104/1106.

FIG. 12 depicts an alternate channel configuration configured to reduce misalignment due to liquid propagation during IC-substrate attachment, according to embodiments.

Diagram 1200 depicts IC 1210 with contact pad 1212, contact pad 1214, and channel 1216 separating the contact pads. Channel 1216 may have a depth substantially equal to the height of contact pads 1212/1214, or may extend into an underlying layer, such as a repassivation layer (for example, as depicted in FIG. 9). Contact pads 1212 and 1214 are shaped such that channel 1216 has a relatively narrow portion near the center of channel 1216 and IC 1210 and relatively widened channel portions 1252 and 1254 near the ends of channel 1216 and the periphery of IC 1210. The widened channel portions 1252 and 1254 may have substantially larger transverse cross-sections compared to un-widened channel portions (for example, channel portions 1152 and 1154), which facilitates fluid flow from the center of channel 1216 (and IC 1210) towards the ends of channel 1216 (and the periphery of IC 1210), as described below.

In some embodiments, channel 1216 is substantially symmetric about one or more planes. In FIG. 12, channel 1216 is symmetric about planes 1218 and 1220, each depicted as dashed lines. Planes 1218 and 1220 may be orthogonal (i.e., perpendicular) to the surface of IC 1210 on which contact pads 1212 and 1214 are disposed, and may also be orthogonal to each other.

Diagram 1260 depicts liquid adhesive 1208 spreading across IC 1210 when IC 1210 and tag substrate 1202 are pressed together. As described above in diagram 1150, adhesive 1208 may preferentially propagate through channel 1216 in addition to spreading across the surfaces of contact pads 1212 and 1214. In contrast to channel portions 1152/1154, the larger transverse cross-sections of widened channel portions 1252/1254 may facilitate the flow of the fluid adhesive from the center out to the ends of channel 1216 by decreasing the velocity of the propagating adhesive 1208 within widened channel portions 1252/1254. Reduction of the adhesive propagation velocity within each of widened channel portions 1252/1254 may reduce the overall force exerted by adhesive 1208 on IC 1210, tag substrate 1202, and the walls of channel 1216, thereby reducing the likelihood and magnitude of IC movement and reducing the potential and magnitude of misalignment. Moreover, the larger transverse cross-sections of widened channel portions 1252/1254 increase the volume of adhesive which can flow before turbulence occurs, thereby reducing the likelihood of fluid turbulence during adhesive propagation through channel 1216, facilitating fluid adhesive flow out to the channel ends, and also reducing the potential for IC movement and subsequent misalignment.

Figure 13:
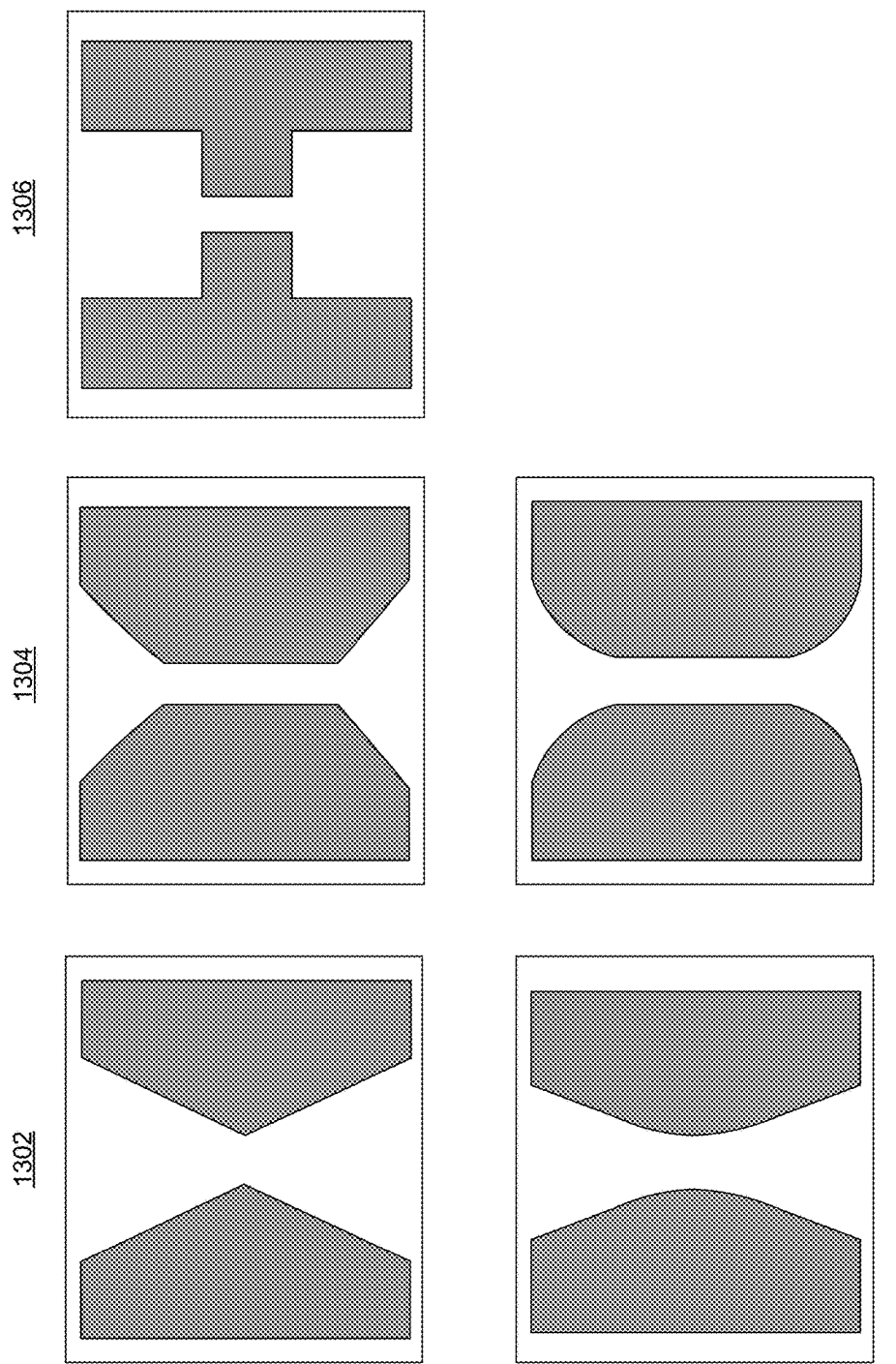
FIG. 13 depicts a number of alternate channel configurations configured to reduce misalignment due to liquid propagation during IC-substrate attachment, according to embodiments.

FIG. 13 depicts a number of alternate channel configurations 1302-1310 configured to reduce misalignment due to liquid propagation during IC-substrate attachment, according to embodiments. The alternate channel configurations 1302-1310, while differing in exact structure, all (a) are substantially wider at the ends of the channels than at the centers of the channels (or "non-convex"), resulting in substantially larger transverse cross-sections at the ends of the channels than at the centers of the channels, and (b) are substantially symmetric about one or more planes. In some embodiments, alternate channel configurations may vary channel depths to provide different transverse channel cross-sections. For example, a channel may be relatively shallow at its center, and may be relatively deep at its ends. The increase in channel depth, in addition to or instead of an increase in channel width, provides larger transverse channel cross-sections at the channel ends compared to the channel center.

Figure 14:
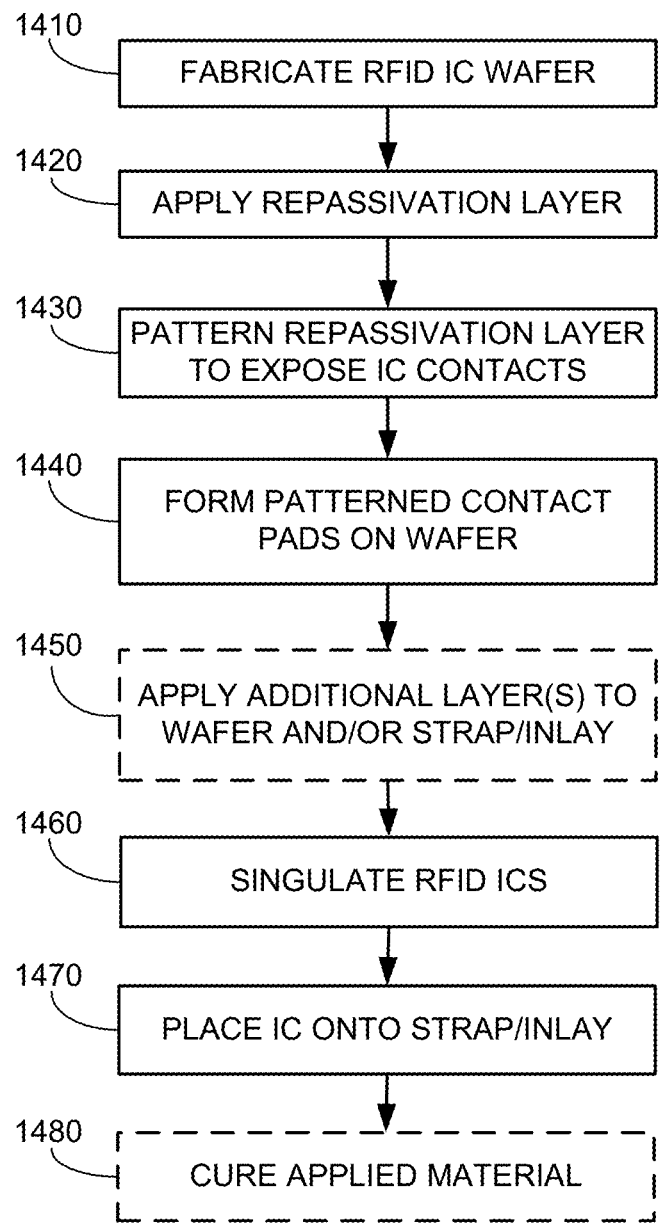
FIG. 14 is a flowchart of a process for fabricating an RFID inlay or strap according to embodiments.

FIG. 14 is a flowchart of process 1400 for fabricating an RFID inlay or strap according to embodiments. Process 1400 begins with step 1410, where an RFID wafer is fabricated. An RFID wafer typically includes multiple RFID ICs as described above. At step 1420 a repassivation layer is applied to the wafer. Subsequently, or as part of forming the repassivation layer, at step 1430 the repassivation layer is patterned to expose IC contacts, for example using techniques such as masking and/or etching. Next, at step 1440, large contact pads may be formed over the repassivation layer. The large contact pads may be formed to electrically couple to the IC contacts exposed at step 1430, and may be patterned, for example, using masking and/or etching, and. In some embodiments, additional conductive contacts or bumps may be used to facilitate the electrical coupling of the large contact pads to the exposed IC contacts. For example, the additional conductive contacts or bumps may be fabricated on the exposed IC contacts before formation of the large contact pads at step 1440.

In some embodiments, one or more additional layers may be applied to the wafer at optional step 1450. These additional layers may include an anisotropic conductive layer, an isotropic conductive layer, and/or a nonconductive layer, and may be organic, inorganic (e.g., metal), or a combination thereof. In some embodiments the additional layers may be patterned. The additional layers may also include adhesives for affixing the ICs to inlays. In some embodiments, the additional layers may be applied to inlays or straps instead of to the wafer.

At step 1460, the RFID ICs are singulated (i.e. separated from each other) by one or more of mechanical sawing, laser dicing, etching, annealing and breaking, or any other suitable singulation method. In some embodiments step 1450 may occur after step 1460. Subsequently, at step 1470, the ICs are placed onto straps or inlays, which include a substrate and a patterned antenna (for an inlay) or patterned contacts (for a strap). In some embodiments, adhesives may be applied to the inlays/straps, the surface of the repassivation layer, and/or the large contact pads before attaching the RFID ICs to the inlays/straps, and the ICs and inlays/straps may be pressed together to facilitate physical and/or electrical coupling. In some embodiments, any applied material (e.g., layers or adhesives applied in step 1450) that was not previously fully cured (e.g., as part of step 1450) may be cured at optional step 1480 using, for example, a thermal and/or mechanical process.

The steps described in process 1400 are for illustration purposes only. An RFID IC may be patterned, singulated, and assembled onto a strap or inlay using additional or fewer steps using the principles described herein. The order of steps may be modified, some steps eliminated, or other steps added. The utility of the process 1400 may be extended as would be obvious to one of ordinary skill in the art, such as for placing an RFID IC onto a printed-circuit board. Finally, in embodiments where the RFID IC is placed onto a strap, additional steps may be required to fabricate an RFID tag from the IC-strap combination.

The foregoing detailed description has set forth various embodiments of the devices and/or processes via the use of block diagrams and/or examples. Insofar as such block diagrams and/or examples contain one or more functions and/or aspects, it will be understood by those within the art that each function and/or aspect within such block diagrams or examples may be implemented, according to embodiments formed, individually and/or collectively, by a wide range of hardware, software, firmware, or virtually any combination thereof.

Embodiments as described herein additionally include programs, and methods of operation of the programs. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter, and in the more general case can include the states of any physical devices or elements. It is convenient at times, principally for reasons of common usage, to refer to information represented by the states of these quantities as bits, data bits, samples, values, symbols, characters, terms, numbers, or the like. It should be borne in mind, however, that all of these and similar terms are associated with the appropriate physical quantities, and that these terms are merely convenient labels applied to these physical quantities, individually or in groups.

Executing a program's steps or instructions may further require storage media that have stored thereon a program's instructions and/or data, typically in a machine-readable form. This storage media is typically termed a memory, read by a processor or other machine element. In electronic devices the memory may be implemented in any of the ways described above, and may be volatile or nonvolatile.

Even though it is said that the program may be stored in a computer-readable medium, it should be clear to a person skilled in the art that it need not be a single memory, or even a single machine. Various portions, modules or features of it may reside in separate memories, or even separate machines. The separate machines may be connected directly, or through a network such as a local access network (LAN) or a global network such as the Internet.

Often, for the sake of convenience only, it is desirable to implement and describe a program as software. The software can be unitary, or thought in terms of various interconnected distinct software modules.

This detailed description is presented largely in terms of flowcharts, algorithms, and symbolic representations of operations on data bits on and/or within at least one medium that allows computational operations, such as a computer with memory. Indeed, such descriptions and representations are the type of convenient labels used by those skilled in programming and/or the data-processing arts to effectively convey the substance of their work to others skilled in the art. A person skilled in the art of programming may use these descriptions to readily generate specific instructions for implementing a program according to the present invention.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, configurations, antennas, transmission lines, and the like, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member.

I claim:

1. A Radio Frequency Identification (RFID) integrated circuit (IC) comprising:
an IC substrate;
a first antenna contact disposed on, and confined within a perimeter of, a surface of the IC substrate; and
a second antenna contact disposed on, and confined within the perimeter of, the surface of the IC substrate; wherein:
the first and second antenna contacts are separated by a channel having a first end, a second end opposite the first end, and a center between the first end and the second end;
the channel spans a majority of a width of the IC substrate;
a first transverse channel cross-section at the first end is substantially the same size as a second transverse channel cross-section at the second end and substantially larger than a third transverse channel cross-section at the center; and
the channel is shaped to facilitate a fluid flow from the center to the first and second ends.

2. The RFID IC of claim 1, wherein the channel is shaped to facilitate a flow of a liquid adhesive during a tag assembly process, thereby reducing movement of the IC during the assembly process.

3. The RFID IC of claim 1, wherein the channel has a non-convex shape.

4. The RFID IC of claim 1, wherein the channel is substantially symmetric about at least one plane orthogonal to the surface of the IC substrate.

5. The RFID IC of claim 1, wherein the channel is substantially symmetric about at least two planes, each of the at least two planes orthogonal to each other and the surface of the IC substrate.

6. The RFID IC of claim 1, wherein the antenna contacts occupy at least half of the area of the surface of the IC substrate.

7. The RFID IC of claim 1, wherein each of the antenna contacts includes:
a raised nonconductive structure; and
a conductive layer disposed on the raised nonconductive structure.

8. A method for assembling a Radio Frequency Identification (RFID) tag, the method comprising:
providing a tag substrate with at least two antenna terminals;
providing an RFID integrated circuit (IC) having:
at least two antenna contacts disposed on and confined within a perimeter of a surface of the IC; and
a channel separating the antenna contacts, and spanning a majority of a width of the IC, and having a first end, a second end opposite the first end, and a center between the first end and the second end; and
attaching the IC to the tag substrate with a fluid adhesive, wherein:
a first transverse channel cross-section at the first end is substantially the same size as a second transverse channel cross-section at the second end and substantially larger than a third transverse channel cross-section at the center; and
the channel is shaped to facilitate a flow of the fluid adhesive from the center to the first and the second ends during the attaching, thereby reducing movement of the IC with respect to the tag substrate caused by the fluid flow.

9. The method of claim 8, wherein the channel has a non-convex shape.

10. The method of claim 8, wherein the channel is substantially symmetric about at least one plane orthogonal to the surface of the IC.

11. The method of claim 8, wherein the channel is substantially symmetric about at least two planes, each of the at least two planes orthogonal to each other and to the surface of the IC.

12. The method of claim 8, wherein the antenna contacts occupy at least half of the area of the surface of the IC.

13. The method of claim 8, wherein each of the antenna contacts includes:
a raised nonconductive structure; and
a conductive layer disposed on the raised nonconductive structure.

14. A Radio Frequency Identification (RFID) tag comprising:
a tag substrate with at least two antenna terminals;
an RFID integrated circuit (IC) attached to the tag substrate with an adhesive, the IC having:
at least two antenna contacts disposed on and confined within a perimeter of a surface of the IC, each of the antenna contacts electrically coupling to a corresponding one of the antenna terminals; and
a channel separating the antenna contacts, spanning a majority of a width of the IC, and having a first end, a second end opposite the first end, and a center between the first end and the second end, wherein:
a first transverse channel cross-section at the first end is substantially the same size as a second transverse channel cross-section at the second end and substantially larger than a third transverse channel cross-section at the center; and
the channel is shaped to facilitate a fluid flow from the center to the first and second ends.

15. The RFID tag of claim 14, wherein the channel is shaped to facilitate a flow of the adhesive during attachment of the IC to the tag substrate, thereby reducing movement of the IC with respect to the tag substrate caused by the adhesive flow.

16. The RFID tag of claim 14, wherein the channel has a non-convex shape.

17. The RFID tag of claim 14, wherein the channel is substantially symmetric about at least one plane orthogonal to the surface of the IC.

18. The RFID tag of claim 14, wherein the channel is substantially symmetric about at least two planes, each of the at least two planes orthogonal to each other and to the surface of the IC.

19. The RFID tag of claim 14, wherein the antenna contacts occupy at least half of the area of the surface of the IC.

20. The RFID tag of claim 14, wherein each of the antenna contacts includes:
a raised nonconductive structure; and
a conductive layer disposed on the raised nonconductive structure.

* * * * *

UNITED STATES PATENT AND TRADEMARK OFFICE
CERTIFICATE OF CORRECTION

PATENT NO. : 9,633,302 B1
APPLICATION NO. : 14/675158
DATED : April 25, 2017
INVENTOR(S) : Harley K. Heinrich It is certified that error appears in the above-identified patent and that said Letters Patent is hereby corrected as shown below:

In the Claims

Column 21, Line 57, Claim 8, delete "contacts, and" and insert -- contacts, --, therefor.

Signed and Sealed this
Sixteenth Day of January, 2018

Joseph Matal
*Performing the Functions and Duties of the
Under Secretary of Commerce for Intellectual Property and
Director of the United States Patent and Trademark Office*

US009633302C1

(12) EX PARTE REEXAMINATION CERTIFICATE (12814th)
United States Patent
Heinrich

(10) Number: US 9,633,302 C1
(45) Certificate Issued: Jan. 3, 2025

(54) RFID INTEGRATED CIRCUITS WITH CHANNELS FOR REDUCING MISALIGNMENT

(71) Applicant: Impinj, Inc., Seattle, WA (US)

(72) Inventor: Harley K. Heinrich, Snohomish, WA (US)

(73) Assignee: IMPINJ, INC., Seattle, WA (US)

Reexamination Request:
No. 90/019,357, Dec. 28, 2023

Reexamination Certificate for:
Patent No.: 9,633,302
Issued: Apr. 25, 2017
Appl. No.: 14/675,158
Filed: Mar. 31, 2015

Certificate of Correction issued Jan. 16, 2018

(51) Int. Cl.
*H01L 23/00* (2006.01)
*H01L 23/66* (2006.01)

(52) U.S. Cl.
CPC ............. *H01L 24/08* (2013.01); *H01L 24/80* (2013.01); *H01L 23/66* (2013.01); *H01L 24/05* (2013.01); *H01L 24/83* (2013.01); *H01L 2224/05558* (2013.01); *H01L 2224/08225* (2013.01); *H01L 2224/293* (2013.01); *H01L 2924/14* (2013.01)

(58) Field of Classification Search
CPC ......... H01L 24/08; H01L 24/80; H01L 24/05; H01L 24/83; H01L 2224/05; H01L 2224/08; H01L 2224/29; H01L 2924/14; H01L 23/66

See application file for complete search history.

(56) References Cited

To view the complete listing of prior art documents cited during the proceeding for Reexamination Control Number 90/019,357, please refer to the USPTO's Patent Electronic System.

*Primary Examiner* — C. Michelle Tarae

(57) ABSTRACT

Embodiments are directed to an RFID tag integrated circuit (IC) having antenna contacts separated by a channel. The channel has a smaller cross-section at its center than at its ends, which facilitates fluid flow from the channel center to the channel ends. During attachment of the IC to an inlay or strap, the channel facilitates the flow of liquid adhesive so as to reduce the turbulence and the propagation velocity associated with the liquid adhesive, thereby reducing misalignment caused by the movement of the IC with respect to the inlay or strap.

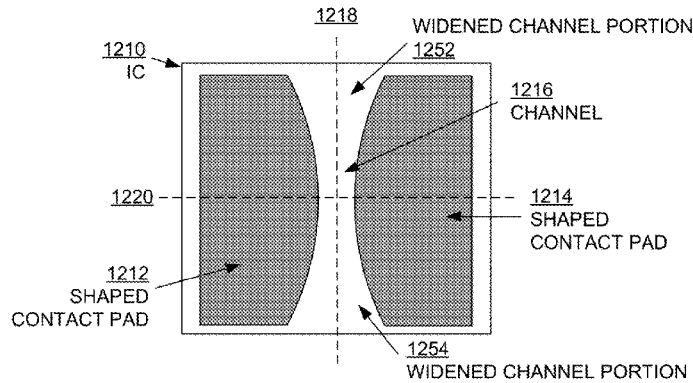

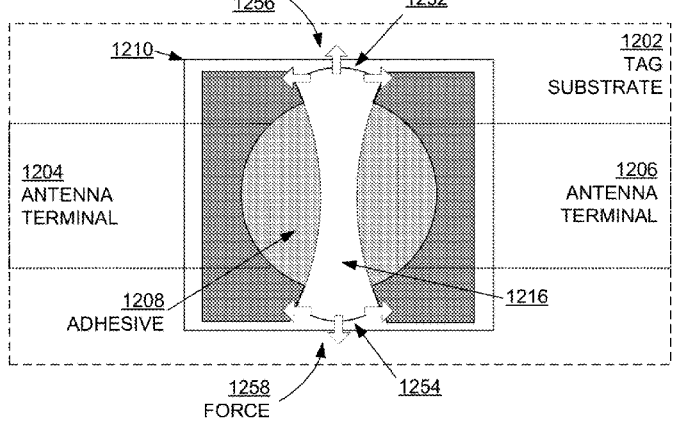

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1, 3, 4, and 7 is confirmed.

New claims 21-28 are added and determined to be patentable.

Claims 2, 5-6, and 8-20 were not reexamined.

21. *A Radio Frequency Identification (RFID) integrated circuit (IC) comprising:*
   *an IC substrate;*
   *a first antenna contact disposed on, and confined within a perimeter of, a surface of the IC substrate; and*
   *a second antenna contact disposed on, and confined within the perimeter of, the surface of the IC substrate; wherein:*
      *the first and second antenna contacts are separated by a channel having a first end near a periphery of the IC, a second end near the periphery of the IC and opposite the first end, and a center between the first end and the second end and near a midpoint of the IC;*
      *the channel spans a majority of a width of the IC substrate;*
      *a first transverse channel cross-section at the first end is substantially the same size as a second transverse channel cross-section at the second end and substantially larger than a third transverse channel cross-section at the center; and*
      *the channel is shaped to facilitate a fluid flow from the center to the first and second ends.*

22. *The RFID IC of claim 21, wherein the channel has a non-convex shape.*

23. *The RFID IC of claim 21, wherein the channel is substantially symmetric about at least one plane orthogonal to the surface of the IC substrate.*

24. *The RFID IC of claim 21, wherein each of the antenna contacts includes:*
   *a raised nonconductive structure; and a conductive layer disposed on the raised nonconductive structure.*

25. *A Radio Frequency Identification (RFID) integrated circuit (IC) comprising:*
   *an IC substrate;*
   *a nonconductive repassivation layer disposed on a surface of the IC substrate;*
   *a first antenna contact disposed on the repassivation layer and confined within a perimeter of a surface of the IC substrate; and*
   *a second antenna contact disposed on the repassivation layer and confined within the perimeter of the surface of the IC substrate; wherein:*
      *the first and second antenna contacts are separated by a channel having a first end near a periphery of the IC, a second end near the periphery of the IC and opposite the first end, and a center between the first end and the second end and near a midpoint of the IC;*
      *the channel spans a majority of a width of the IC substrate;*
      *a first transverse channel cross-section at the first end is substantially the same size as a second transverse channel cross-section at the second end and substantially larger than a third transverse channel cross-section at a narrowest part of the center; and*
      *the channel is shaped to facilitate a fluid flow from the center to the first and second ends.*

26. *The RFID IC of claim 25, wherein the channel has a non-convex shape.*

27. *The RFID IC of claim 25, wherein the channel is substantially symmetric about at least one plane orthogonal to the surface of the IC substrate.*

28. *The RFID IC of claim 25, wherein each of the antenna contacts includes:*
   *a raised nonconductive structure; and a conductive layer disposed on the raised nonconductive structure.*

\* \* \* \* \*